(12) United States Patent
Kerr et al.

(10) Patent No.: US 7,538,756 B2
(45) Date of Patent: May 26, 2009

(54) METHODS FOR MAKING DISPLAY

(75) Inventors: Roger S. Kerr, Brockport, NY (US); Timothy J. Tredwell, Fairport, NY (US)

(73) Assignee: Eastman Kodak Company, Rochester, NY (US)

( * ) Notice: Subject to any disclaimer, the term of this patent is extended or adjusted under 35 U.S.C. 154(b) by 885 days.

(21) Appl. No.: 11/016,459

(22) Filed: Dec. 17, 2004

(65) Prior Publication Data
US 2006/0132477 A1  Jun. 22, 2006

(51) Int. Cl.
G09G 3/36 (2006.01)
(52) U.S. Cl. .................................................. 345/104
(58) Field of Classification Search ................. 345/104, 345/107, 156–184, 10
See application file for complete search history.

(56) References Cited

U.S. PATENT DOCUMENTS

| | | | |
|---|---|---|---|
| 5,545,291 A | 8/1996 | Smith et al. | |
| 5,707,745 A | 1/1998 | Forrest et al. | |
| 5,721,160 A | 2/1998 | Forrest et al. | |
| 5,757,026 A | 5/1998 | Forrest et al. | |
| 5,825,529 A * | 10/1998 | Crowley | 345/107 |
| 5,834,893 A | 11/1998 | Bulovic et al. | |
| 5,861,219 A | 1/1999 | Thompson et al. | |
| 5,904,916 A | 5/1999 | Hirsch | |
| 5,986,401 A | 11/1999 | Thompson et al. | |
| 5,998,803 A | 12/1999 | Forrest et al. | |
| 6,013,538 A | 1/2000 | Burrows et al. | |
| 6,046,543 A | 4/2000 | Bulovic et al. | |
| 6,048,573 A | 4/2000 | Tang et al. | |
| 6,048,630 A | 4/2000 | Burrows et al. | |
| 6,066,357 A | 5/2000 | Tang et al. | |
| 6,125,226 A | 9/2000 | Forrest et al. | |
| 6,137,223 A | 10/2000 | Hunt et al. | |
| 6,242,115 B1 | 6/2001 | Thomson et al. | |
| 6,274,980 B1 | 8/2001 | Burrows et al. | |
| 7,109,967 B2 * | 9/2006 | Hioki et al. | 345/104 |
| 7,119,759 B2 * | 10/2006 | Zehner et al. | 345/107 |
| 2002/0130831 A1 * | 9/2002 | Engler et al. | 345/107 |
| 2006/0131504 A1 * | 6/2006 | Kerr et al. | 345/82 |

* cited by examiner

*Primary Examiner*—David L Lewis
(74) *Attorney, Agent, or Firm*—Roland R. Schindler

(57) ABSTRACT

Methods for forming a display using imaging elements are provided. In one method, a first surface is provided and imaging elements are provided on the first surface. The imaging elements are positionally aligned and a location order is determined for the imaging elements. Wherein the imaging elements each comprise: a wireless communication circuit adapted to detect a wireless communication signal and to generate a control signal; an illumination circuit having an illumination element, said illumination circuit being adapted so that the illumination element generates light at an intensity that is based upon the control signal. A body is provided containing the wireless communication circuit and the light source; wherein the body occupies a space that is less than about five cubic millimeters.

32 Claims, 19 Drawing Sheets

METHODS FOR MAKING DISPLAY

CROSS-REFERENCE TO RELATED APPLICATIONS

This application is related to U.S. Ser. No. 11/015,904 entitled DISPLAY, in the name of Kerr et al.; and U.S. Ser. No. 11/016,377 entitled IMAGING ELEMENT, in the name of Kerr et al., all filed concurrently herewith.

Reference is made to commonly assigned, co-pending application U.S. Ser. No. 10/631,092, entitled A DIGITAL IMAGING ELEMENT in the name of Daniel Haas, filed on Jul. 31, 2003 and incorporated herein by reference.

FIELD OF THE INVENTION

The invention relates generally to the field of light emitting image displays, and in particular, methods for making displays.

BACKGROUND OF THE INVENTION

There is a general desire in the art of display technology to provide displays with high-resolution as measured in a number of imaging elements per unit area of the display surface and to provide displays that are low in cost. These objectives can be difficult to achieve in a single display. In particular, it is conventionally known to form a display device by depositing a plurality of individual light emitting materials in a pattern on a surface. These deposits of light emitting material are adapted to radiate light when exposed to electrical energy and are referred to herein as light emitting elements. Control electronics are also deposited on the surface of such a display that enable a controller to selectively provide a controlled amount power to each image display element. Such control circuits are generally known in the art as a "backplane".

It will be appreciated that both the light emitting elements and backplane require a certain amount of the space on the surface. As the number of light emitting elements increases, there is a concomitant need for an ever-larger number of control lines in the backplane. However, as the number of light emitting elements per unit area on a display increases, there is a decrease in available space between light emitting elements for the control lines and other circuits of the backplane. Therefore, as the number of light emitting elements in the display increases, it becomes substantially more difficult to define a backplane on the same surface as the light emitting elements.

One way to solve this problem is to the form a display using a plurality of layers. In a first layer formed on the surface, light emitting elements are formed on the surface in a first layer and a second layer is overlaid onto the first layer with the second layer having backplane circuits arranged to cooperate with the light emitting elements of the imaging plane. This approach can cause a variety of problems. For example, interlayer registration problems become difficult to solve in high-resolution displays. This is because as the size of the light emitting elements is reduced it becomes increasingly difficult to align the circuits of the backplane with appropriate light emitting elements formed as another layer on the surface. Further, the forming of multiple layers adds assembly steps and introduces the possibility of damaging the light emitting elements in the process of applying the backplane. It will be appreciated that, even a single damaged light emitting element in a display can introduce an artifact in a displayed image that renders the display unsatisfactory for use by a consumer.

There is also desire in the art to form displays using non-conventional surfaces such as flexible substrates. One barrier to the development of displays on flexible substrates is that it is difficult to maintain the integrity of the relationship between the backplane and the light emitting elements when the surface upon which they are formed can be deformed. Further, there is a desire to form displays using non-flat surfaces such as curved or non-flat contours, fabrics, bottles, and the like as substrates, however, it is difficult to form backplanes using such surfaces.

Accordingly what is needed in the art is a method for making a display that is substantially different from those that are currently known in the art.

SUMMARY OF THE INVENTION

The present invention is a method for forming a display using imaging elements adapted to generate light, the method comprising the steps of: providing a first surface; providing imaging elements on the first surface; positionally aligning the imaging elements; and determining a location order for the imaging elements, wherein the imaging elements each comprise: a wireless communication circuit adapted to detect a wireless communication signal and to generate a control signal; an illumination circuit having an illumination element, said illumination circuit being adapted so that the illumination element generates light at an intensity that is based upon the control signal; and a body containing the wireless communication circuit and the light source; wherein the body occupies a space that is less than about five cubic millimeters.

In another aspect of the invention a method for forming a display is provided. In accordance with the method, a slurry is provided comprising a plurality of imaging elements in a fluid. Each imaging element is adapted to cause a radiation sensor to sample radiation and to transmit a wireless signal indicating the amount of radiation in the sample. Each imaging element is further adapted to receive a wireless signal having an illumination value therein and to generate a control signal causing an illumination element to generate light at an intensity that is determined based upon the control signal. The plurality of image elements is adequate in number for sampling an irradiance pattern with sufficient resolution to allow a discernable image to be assembled based upon the samples. The slurry is used to provide a plurality of individual imaging elements across an image capture area of a surface; and each imaging element is associated with location information so that signals from each imaging element can be assembled to form an image of the light that is incident upon the imaging element.

In yet another aspect of the invention is a method for forming a surface is provided. In accordance with the method, a surface is provided comprising a plurality of cavities and a slurry is provided comprising a plurality of imaging elements in a dispersing liquid. The slurry is dispensed over a substrate to deposit, into individual ones of a plurality of cavities, individual imaging elements.

In still another aspect of the invention a method for assigning positional coordinates to an imaging element in a grouping of imaging elements is provided. In accordance with the method, a first reference imaging element is identified at a first coordinate reference point, a second reference imaging element is identified at a second coordinate reference point, and a third reference imaging element is identified at a third coordinate reference point; another imaging element is prompted to emit at least one locator signal. The locator signal is received with locator signals from least each of the first, second, and third reference imaging elements. A triangulation calculation is applied to identify the positional coordinates of the imaging element relative to the first, second, and third coordinate reference points.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

To facilitate understanding, identical reference numerals have been used, where possible, to designate identical elements that are common to the figures.

DETAILED DESCRIPTION OF THE INVENTION

The present description is directed in particular to elements forming part of, or cooperating more directly with, apparatus in accordance with the invention. It is to be understood that elements not specifically shown or described may take various forms well known to those skilled in the art.

Figure 1A:
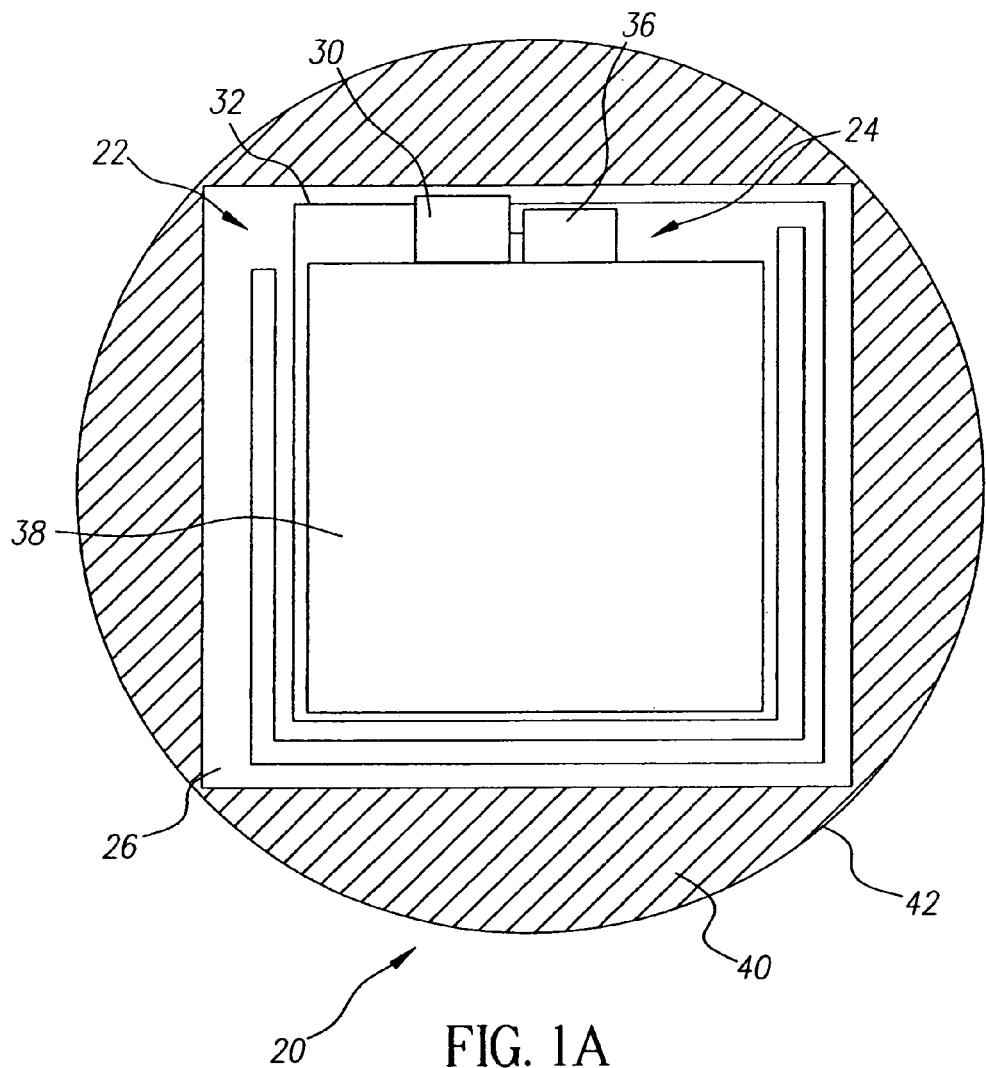
FIG. 1A shows top cutaway view of a one embodiment of an imaging element of the present invention.
Figure 1B:
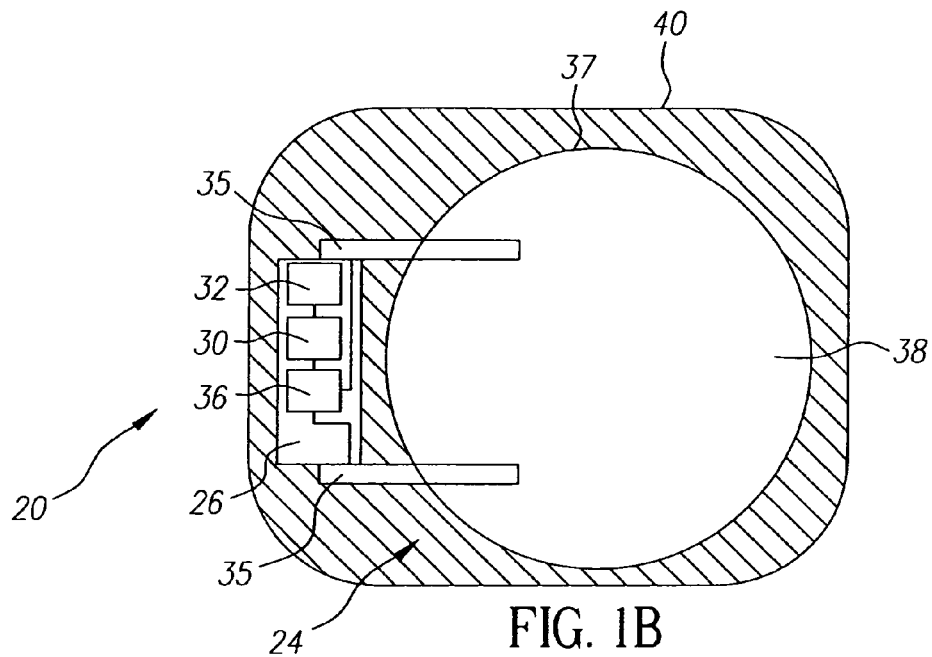
FIG. 1B shows top cutaway view of another embodiment of an imaging element of the present invention.
Figure 1C:
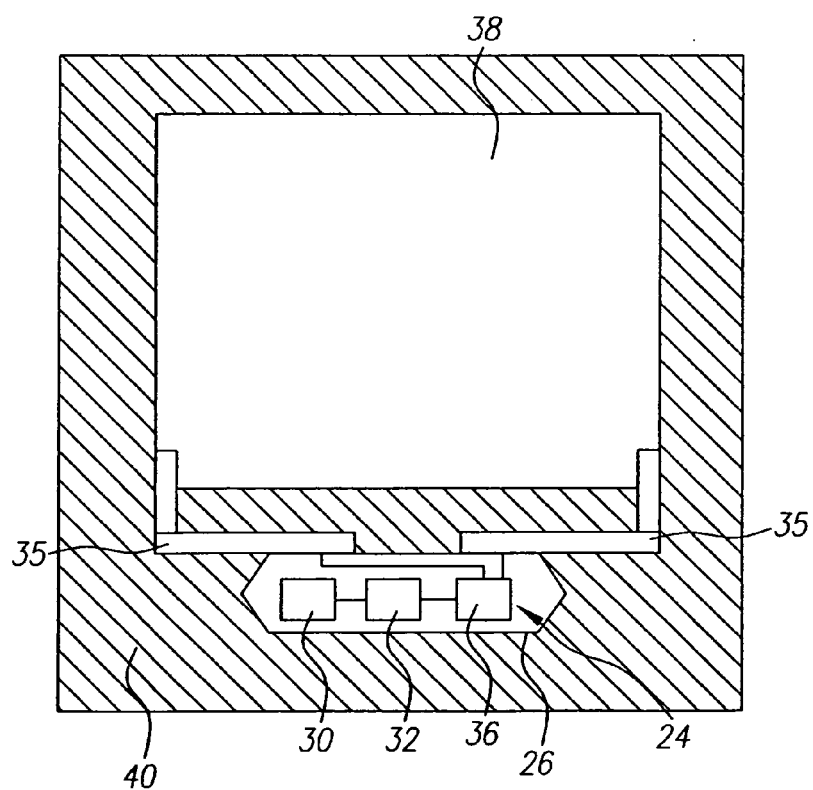
FIG. 1C shows top cutaway view of another embodiment of an imaging element of the present invention.

FIGS. 1A-1C show top cutaway views of one embodiment of an imaging element 20 of the present invention. In the embodiment of FIG. 1A, imaging element 20 comprises a wireless communication circuit 22, an illumination circuit 24 and a support 26. Wireless communication circuit 22 comprises, in this embodiment, a radio frequency receiver circuit 30 and an antenna 32. Antenna 32 is adapted to receive radio frequency signals and to provide the received signals to radio frequency receiver circuit 30. Radio frequency receiver circuit 30 is adapted to process the radio frequency signals received by antenna 32 and, in certain embodiments, to extract energy for operation from the radio frequency signal received by antenna 32.

Radio frequency receiver circuit 30 has an identification code associated therewith and is adapted to sense whether a received signal has the associated identification code. When radio frequency receiver circuit 30 detects a radio frequency signal having the associated identification code, radio frequency receiver circuit 30 is adapted to generate an illumination control signal having a value that is based upon an illumination value that is encoded in the received wireless communication signal. Radio frequency receiver circuit 30 provides the illumination control signal to illumination circuit 24. In certain embodiments, radio frequency receiver circuit 30 can also be adapted to receive certain radio frequency signals that contain generic instruction codes to which radio frequency receiver circuit 30 will react despite the absence of an identification code specific to imaging element 20. For example, in such embodiments, radio frequency receiver circuit 30 can be adapted to receive codes such as "all off" or "reduce brightness" that generically apply to an entire set of imaging elements 20 when such imaging elements 20 are used collectively in a display as will be described in greater detail below.

Illumination circuit 24 has an illumination control circuit 36 and an illumination element 38. Illumination control circuit 36 is an electrical circuit that is adapted to control an amount of electrical energy passing from a power source to the illumination element 38 based upon the control signal received from radio frequency receiver circuit 30. Illumination element 38 can comprise any material that is adapted to receive electrical energy and to generate an amount of light in proportion to the amount of received electrical energy. In this regard, illumination element 38 can comprise, for example, a light emitting diode, an organic light emitting diode element, a florescent or incandescent light element, or an electroluminescent element. Illumination element 38 can be adapted to provide one wavelength, frequency, or color of light or multiple wavelengths, frequencies or colors of light.

Illumination element 38 can take on any of a variety of shapes, including, for example, the rectangular shape illustrated in FIG. 1A as well as circular, square or other convenient shapes.

In one embodiment, radio frequency receiver circuit 30 is adapted to provide an illumination control signal in the form of a voltage signal having an amplitude that varies in accordance with the illumination value in a received radio frequency signal. In this embodiment, illumination control circuit 36 comprises a voltage controlled gate such as a transistor that is electrically in series between the power source and the illumination element 38. Illumination control circuit 36 is adapted to receive a control signal having a voltage within a range and to control the amount of energy passing to the illumination element 38 based upon the control signal.

In another example embodiment, radio frequency receiver circuit 30 is adapted to receive a radio frequency signal that contains an illumination value and a light characteristic value that defines a characteristic of the light to be emitted by illumination circuit 24. The light characteristic value can define, for example, a preferred wavelength, frequency or color for the light. In response to this, radio frequency receiver circuit 30 generates an illumination control signal that is based upon both of illumination control value and the light characteristic value. In such an embodiment, illumination circuit 24 has an illumination control circuit 36 and an illumination element 38 that are capable of selectively generating light in more than one wavelength, frequency, or color. For example, illumination control circuit 36 can be adapted to drive illumination element 38 in a variety of different manners to achieve different colors. In another example, illumination element 38 can be provided with a combination of separate areas that are each adapted to radiate light having a particular wavelength, frequency or color and that can be selectively actuated by illumination control circuit 36 to provide light having characteristics called for in the illumination control value and/or light characteristic value in the radio frequency signal.

It will also be appreciated, from this embodiment, that the combination of wireless communication circuit 22 and illumination circuit 24 provide an imaging element 20 that generates an amount of light that is based upon the illumination value contained in a wireless signal received by radio frequency receiver circuit 30 and addressed to radio frequency receiver circuit. By using the codes, a transmitter (not shown) can transmit signals that individually address single imaging elements 20 in an array comprising a plurality of imaging elements 20 for purposes including but not limited to controlling the amount of light emitted by each imaging element 20 without need for backplane control wires.

In FIGS. 1A-1C, embodiments of imaging element 20 are shown that comprise a body 40 for the wireless communication circuit 22 and the illumination circuit 24. Body 40 provides protection for wireless communication circuit 22 and illumination circuit 24 and defines an outer surface 42 for light emitting element 20. In the embodiment shown in FIGS. 1A and 1B, body 40 is shown in a circular form. However, this is not necessary. Body 40 can have a variety of shapes as desired by the functional and/or aesthetic requirements of the use to which imaging element 20 is put. For example, such as the shape illustrated in FIG. 1C. Typically, body 40 will completely enclose wireless communication circuit 22 and illumination circuit 24.

Generally speaking, body 40 can be made from a wide variety of materials. For example, body 40 can comprise a thermoplastic, a glass, an organic material, or an inorganic material. Typically, body 40 is provided on imaging element 20 so as to provide protection to prevent materials in an environment within which the imaging element 20 is placed from contacting wireless communication circuit 22 or illumination circuit 24 to thereby protect wireless communication circuit 22 and illumination circuit 24 or any other circuits or systems of imaging element 20 from environmental degradation. For example, body 40 can be formed as a material that is applied to communication circuit 22 and/or illumination circuit 24 so as to provide a barrier to prevent environmental contaminants from contacting communication circuit 22 or illumination circuit 24. Examples of such materials include moisture resistant barrier materials, thermally resistant barrier materials, shock resistant materials, particulate matter resistant materials, biocidal materials, radiation resistant materials and materials adapted for electrical field insulation. Alternatively, body 40 can be adapted with such materials such as by coating or otherwise applying barrier layers of such materials on or in body 40. Further, body 40 can be adapted with combinations of such materials.

Body 40 can also be formed from or adapted with materials that are adapted to prevent unwanted migration of materials from within body 40 into the environment. For example, body 40 can formed from materials or otherwise adapted to prevent migration of materials used in the formation of wireless communication circuit 22 or illumination circuit 24 so as to extend the life of these components. Body 40 can completely encapsulate communication circuit 22, illumination circuit 24 and support 26. Alternatively, body 40 can be formed at least in part using support 26 so that support 26 comprises at least part of an outer surface 42 of body 40 and support 26 combined to form an outer surface 42.

Imaging element 20 is generally small sized, occupying space that is less than about 5 cubic mm. However, the overall size and shape of imaging element 20 can be defined in any number of ways. When imaging element 20 is adapted for use in relatively high resolution displays, imaging element 20 can have a size that is substantially less than about 5 cubic mm and can have, for example and without limitation, a size that is, the order of less than 0.001 cubic mm.

Typically, body 40 can be made from transparent or translucent materials so that light emitted by the illumination circuit 24 can be seen outside of outer surface 42. In one embodiment, body 40 is formed from a material that is adapted to absorb selected wavelengths, frequency, or colors of light. In another embodiment, body 40 is made of a transparent material such as a glass or clear thermoplastic.

In the embodiment of FIG. 1B, body 40 is formed in part from a deposit a light emitting material 37 that emits light when exposed to energy, and such material is used to form an illumination element 38 within body 40. In this embodiment, illumination control circuit 36 is adapted with electrodes 35 that apply electrical energy to the deposit of light emitting material 37. As is shown in FIG. 1C, deposit of light emitting material 37 is applied within a matrix of material forming body 40.

Imaging element 20 can derive power for operation from a variety of sources. In the embodiments shown in FIG. 1A-1C, imaging element 20 has a radio frequency receiver circuit 30 that is adapted to derive operational power from radio frequency signals that are broadcast proximate to the radio frequency receiver circuit 30. For example, radio frequency signals that can be received by a radio frequency receiver circuit 30 and used to provide the power for operational purposes including, but not limited to, signals used to send illumination values to the imaging element 20 and signals intended for transmission to other imaging elements 20 in an array of such elements. Alternatively, radio frequency receiver circuit 30 and antenna 32 can be adapted to detect a wireless signal that is adapted to provide power to imaging elements 20 for operation and illumination without such signal necessarily having illumination values encoded therein. Power obtained for operational purposes can be used for purposes including but not limited operating wireless communication circuit 22, radio frequency receiver circuit 30.

Figure 2:
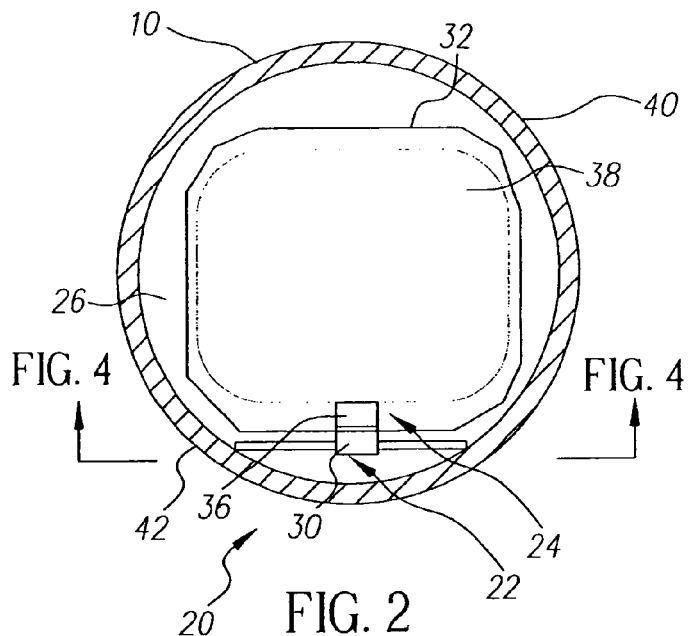
FIG. 2 shows a top partial section view of another embodiment of an imaging element of the present invention.
Figure 3:
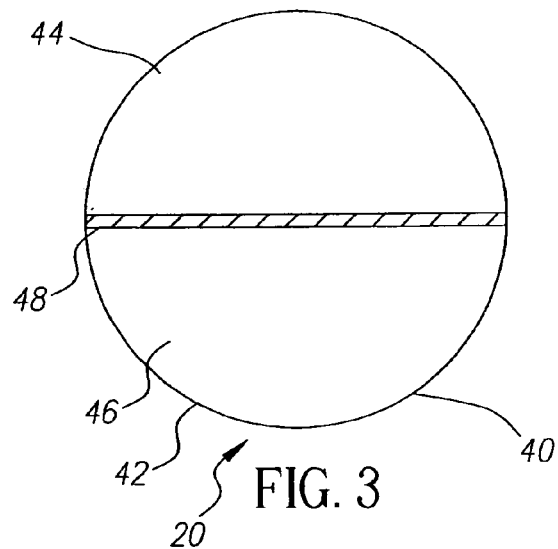
FIG. 3 shows exterior view of one embodiment of the embodiment of FIG. 2.
Figure 4:
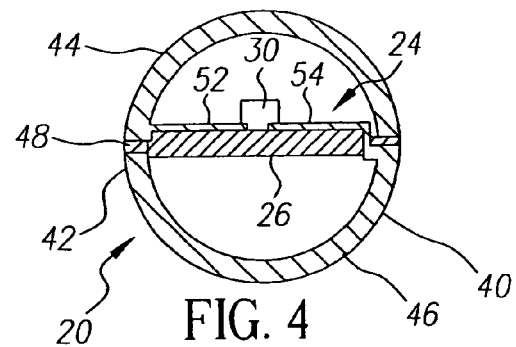
FIG. 4 shows a partial cross-section view of the embodiment of FIG. 2.

Turning now to FIGS. 2-4 what is shown, respectively, is a top partial section view, an exterior side view, and a partial cross-section of another embodiment of imaging element 20. In this embodiment, imaging element 20 has a body 40 with a first electrically conductive portion 44 on outer surface 42, a second electrically conductive portion 46 and an electrical insulator 48 therebetween. Electrical conductors 52 and 54 provide electrical pathways from first electrically conductive portion 44 and from second electrically conductive portion 46 to wireless communication circuit 22 and/or illumination circuit 24. This allows a power supply that is separate from imaging element 20 to provide power for use in operating any or all of radio frequency receiver circuit 30, illumination control circuit 36, or illumination element 38.

Figure 5A:
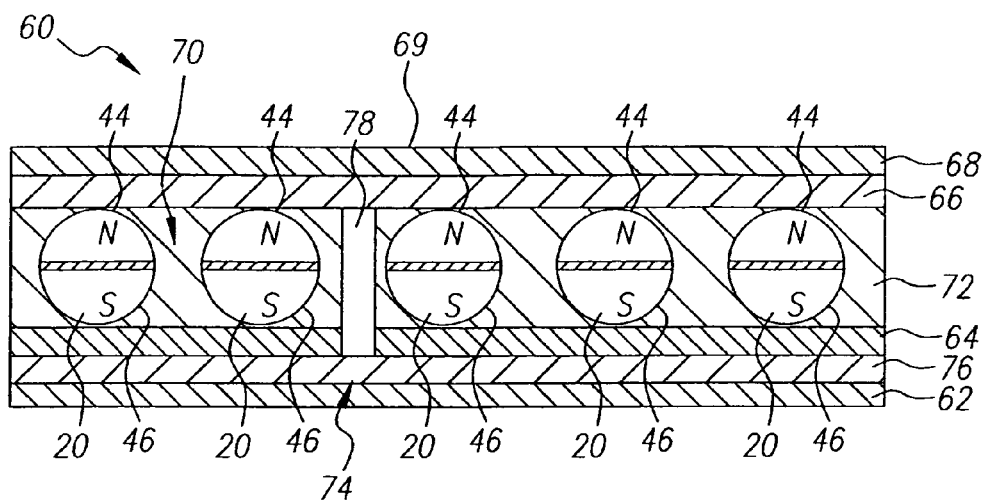
FIG. 5A illustrates a sectional view of a first embodiment of a display using imaging elements.

FIG. 5A shows one section of a display 60 that is adapted to use the imaging elements 20 of the embodiment of FIGS. 2-4. As is shown in FIG. 5A, a first layer 62 of display 60 is provided and a first conductive layer 64 is formed thereon. A plurality of imaging elements is provided in an array 71 on first conductive layer 64 with second electrically conductive portion 46 thereon. A second conductive layer 66 is formed separate from first conductive layer 64 and in contact with the first electrically conductive portion 44 thereon. The conductive layers 64 and 66 can be formed of conventional conductive material such as a metal deposits or metallic coatings, a semi-conductor coating and the like. In certain embodiments, it may be useful to provide a conductive layer that is essentially transparent. For such purposes a material such as Indium Tin Oxide, pentazine and the like. This listing of such essentially transparent conductive materials is illustrative only and is not limiting.

In the embodiment shown, an electrically insulative layer 72 is disposed between first conductive layer 64 and second conductive layer 66. The electrically insulative layer 72 can comprise, generally, any dielectric material including, but not limited to, air, inert gasses, and other gasses, that generally are not conductive with a range of expected operating conditions. Other materials such as thermoplastic materials, organic materials having dielectric properties, and inorganic materials having dielectric properties can be used.

As shown in FIG. 5A, a power supply 74 provides electrical energy to imaging elements 20 by way of electrically conductive layers 64 and 66. Power supply 74 can comprise, for example, a battery, fuel cell, line voltage, rectified line voltage or any other conventional source of electrical energy. In the embodiment shown in FIG. 5, a power supply 74 is provided in the form of a battery formed on a layer 76 on display 60. Layer 76 is electrically connected to second conductive layer 66 directly, and is connected to first electrically conductive layer 64 (as necessary) by an interlayer power connector 78 that is insulated from contact with second electrically conductive layer 66. Such a battery can be of a rechargeable type. Power supply 74 can be formed as a part of display 60 in ways other than providing a battery layer, can be external to display 60 with connectors adapted to join power supply 74 to first conductive layer 64 and second conductive layer 66.

It will be appreciated from the above that because the amount of light emitted by imaging elements 20 of display 60 is controlled by way of wireless signals it is not necessary to separately control the amount of electrical energy actually delivered to each imaging element 20. Accordingly, power supply 74 can provide electrical energy in a common fashion to all of imaging elements 20 in an array 71 by way of first conductive layer 64 and second conductive layer 66 that do not have individual paths to each imaging element. This greatly simplifies assembly and design of display 60 as, in some embodiments, first conductive layer 64 and second conductive layer 66 can comprise layers of conductive material that do not have a predetermined pattern of conductive material and therefore do not require registration with individual imaging elements 20.

In other embodiments electrically conductive layers 64 and 66 can be patterned as desired. However, as there is no need to individually regulate the amount of energy flowing to each element in a patterned conductive layer, larger conductors can be used and registration problems between the conductive layers and the imaging elements 20 are greatly reduced. This reduces the challenge properly assembling display 60 and provides a display 60 with increased durability.

In still other embodiments, a single conductive layer such as first conductive layer 64 can be provide with a pattern of alternating conductors adapted to engage first electrically conductive portion 44 and second electrically conductive portion 46 to define a difference of potential to provide power thereto. Here too, because there is no need to define individually patterned conductors for each individual imaging element 20, a display 60 of this type can be more easily manufactured and can offer greater durability than existing displays.

Figure 5B:
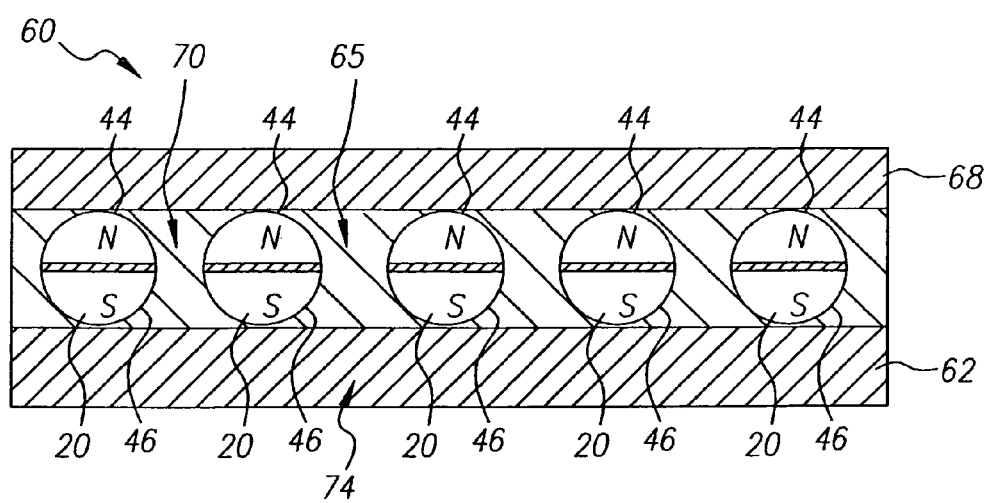
FIG. 5B illustrates a sectional view of a second embodiment of a display using image elements.

In a further embodiment shown in FIG. 5B, imaging elements 20 are disposed between a first layer 62 and a second layer 64 of a display 60 that is adapted to provide a fluid around imaging elements 20, with fluid 65 that is adapted so that a difference of potential between a first electrically conductive portion 44 and disposed in one portion of fluid 65 and a second electrically conductive portion 46 of imaging elements 20 disposed in a different portion of a fluid 65. Fluid 65 can be provided as a static fluid in a liquid form, gel form or in the form of a flow of fluid.

In certain embodiments, the orientation of imaging element 20 with respect to support 26 can be of importance. Further, the orientation of imaging element 20 relative to contacts adapted to engage first and second conductive portions 44 and 46 can be of importance. In the embodiment shown in FIG. 5A, each imaging element 20 is shown optionally adapted with a magnetic polarity so that when it is exposed to a magnetic field, imaging element 20 will orient itself in accordance with such a field. Such magnetic orientation can be used to properly align with imaging elements 20 of array 71 to ensure that light radiated by each imaging element 20 in array 71 is radiated in a desired manner or in a desired direction and/or to ensure that the first electrically conductive portion 44 and second electrically conductive portion 46 are properly aligned to engage contacts such as a conductive layer 64 or 66 that provide electrical energy from power supply 74. In this regard, body 40 can be formed of or otherwise provided with a coating of a material that allows imaging element 20 to react to an applied electric field. Other forms of electromagnetic bias can be introduced into an illumination element 38 for this purpose including but not limited to an electrostatic bias.

A second layer 68 is shown in FIG. 5A. Second layer 68 can be used to secure imaging elements 20, and conductive layer 64 and optionally, to also secure conductive layer 66, insulative layer 72, power supply 74, battery layer 76 and interlayer power connector 78 as desired. Further, second layer 68 can be adapted to join with first layer 62 to provide an enclosure to encapsulate imaging element 20, and conductive layer 64 and optionally, to also secure conductive layer 66, insulative layer 72, power supply 74, battery layer 76 and interlayer power connector 78 as desired.

In the embodiment that is shown in FIG. 5A, second layer 68 is optionally applied to form a top surface 69 of display that does not have protrusions caused by imaging elements 20, and conductive layer 64 and optionally, to also secure conductive layer 66, insulative layer 72, power supply 74, battery layer 76 and/or interlayer power connector 78.

There is a general desire in the art for the displays 60 that are the relatively thin. Using imaging elements 20 in the present invention, it is possible to form a display having the very little thickness. In this regard, the size of imaging elements 20 makes it possible to form a display 60 having a first layer and a second layer that are separated by distance of less than 1 mm. Thus, imaging elements 20 of the present invention can be used to form both displays having conventional thicknesses, as well as displays having greatly reduced thicknesses. Further, it will be appreciated that a thickness of a display 60 that can be formed from imaging elements 20 is also reduced because a display 60 formed using imaging elements 20 can have fewer layers of the type that are used for a backplane purposes in conventional imaging technologies.

Figure 6:
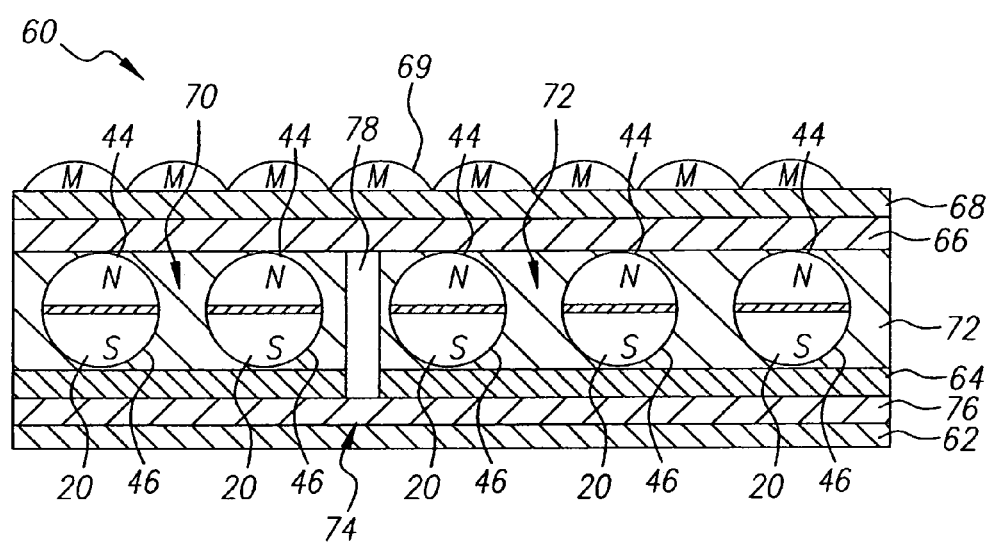
FIG. 6 shows the display section of FIG. 5A having a top surface adapted with the microlenses.

As shown in FIG. 6, top surface 69 can also be patterned or otherwise adapted with for example, micro-lenses M to focus light traveling to or from, imaging elements. As is also illustrated in FIG. 6, in one embodiment, an optional overcoat layer 70 can be provided on top surface 69, imaging elements 20 and/or other portions of display 60.

In one embodiment, first layer 62, second layer 68 and/or overcoat layer 70 can comprise a transparent material or a nearly transparent material. In some embodiments, first layer 62, second layer 68 and/or overcoat layer 70 can comprise any of a number of less than transparent materials such as diffusion materials, filtering material and the like. Additionally, first layer 62, second layer 68 and/or overcoat layer 70 can also optionally be formed from materials that can prevent display 60 from damage that can occur when it is exposed to thermal, electrical, magnetic or other forms of energy such as materials that block the flow of ultraviolet or other forms of radiation or from damage that can occur because of exposure to environments that can damage the components, or because of damage that can occur during handling or manipulation of a display 60 or that provides protection against mechanical, thermal, chemical or other factors that may damage imaging elements 20 or other components of display 60.

Figure 7:
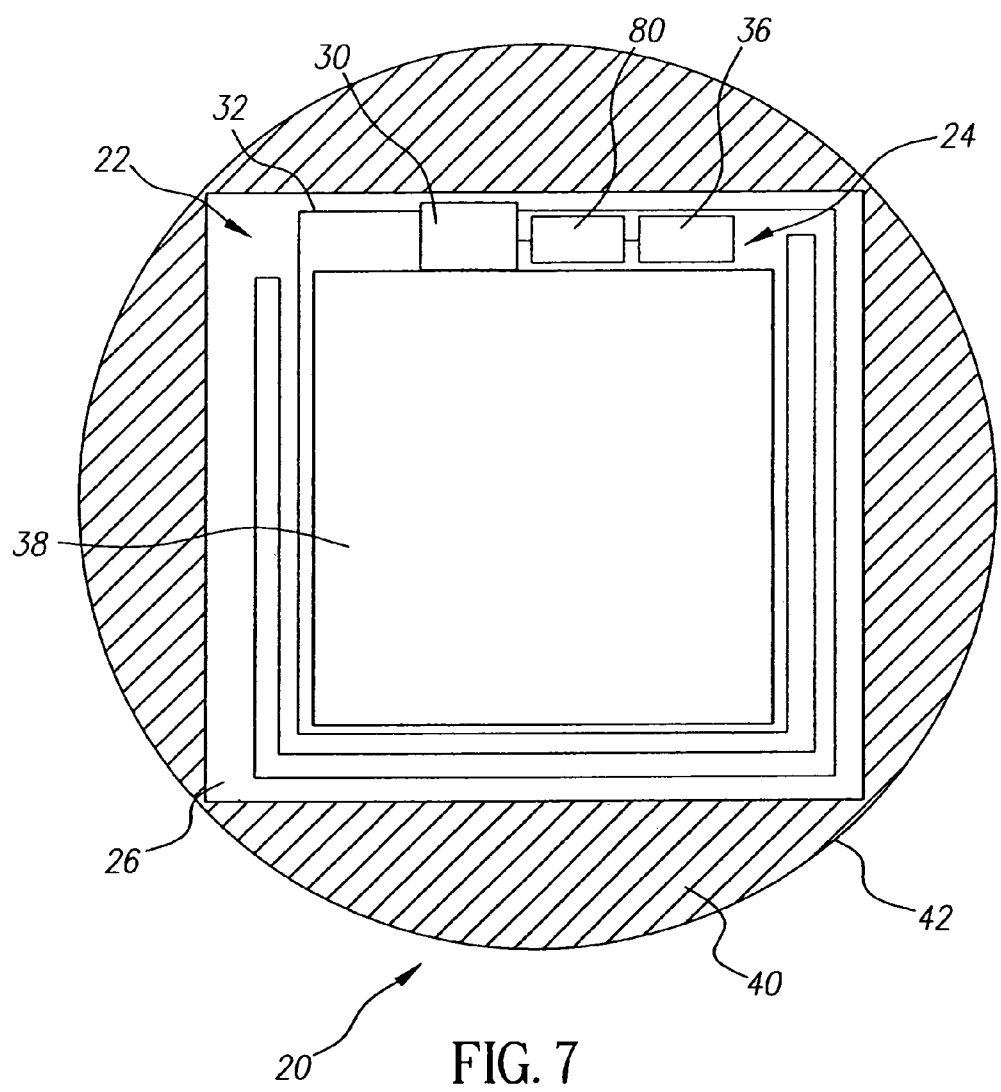
FIG. 7 shows an embodiment of an imaging element having a memory.

FIG. 7 shows yet another embodiment of an imaging element 20 in accordance with the present invention. In the embodiment of FIG. 7, imaging element 20 can comprise any of the above-described embodiments and also incorporates an optional memory 80. Memory 80 is adapted to store at least one illumination control signal for use in controlling the light emitted by the illumination circuit 24. This additional stored illumination control signal can be used as a default condition so that as display 60 is activated, an initial image or default image will be presented by an array of imaging elements 20 in display 60. Alternatively, memory 80 can have the capability of storing a plurality of illumination control signals. In such an embodiment, wireless signals can be provided to select one of the stored illumination control signals for presentation using the imaging element 20. Further, wireless control signals can be generated that cause wireless communication circuit 22 to store new illumination control signals in memory 80.

Figure 8:
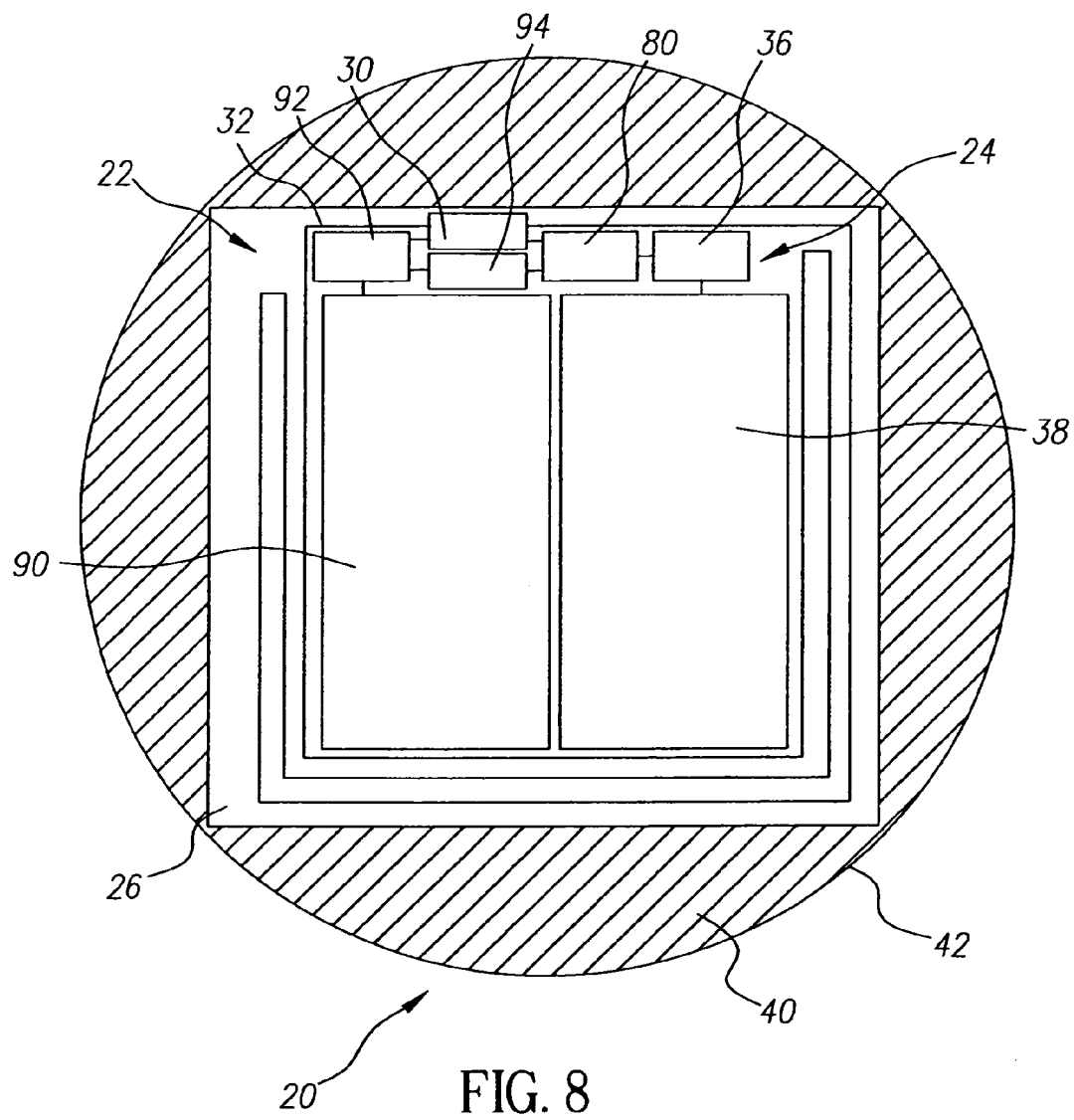
FIG. 8 illustrates one embodiment of an imaging element having a radiation sensor.

Referring now to FIG. 8, what is shown is an embodiment of imaging element 20 of FIG. 7 further comprising a radiation sensor 90 and sensor driver 92. Radiation sensor 90 is adapted to sense at least one form of electromagnetic radiation by converting such forms of energy into a sensed radiation signal. Such forms of radiation can include, but are not limited to, visible light, x-ray radiation, ultraviolet light, and infrared light.

Sensor driver 92 is adapted to monitor the sensed radiation signal and to provide a sensed value signal that indicates an amount of radiation incident on radiation sensor 90 during an exposure time. In one embodiment, the exposure time is a predetermined period of time. In another embodiment, the exposure time is determined dynamically with sensor driver 92 establishing an exposure time based upon the amount radiation incident on radiation sensor 90 during a pre-sampling period, or even during an initial portion of the exposure time. In still another embodiment, the exposure time can be defined by a device that is external to an imaging element 20, with the external device (not shown) transmitting a wireless signal to cause radio frequency receiver circuit 30 to transmit a sensor driver control signal. Sensor driver 92 receives the sensor driver control signal and can determine the exposure time therefrom.

In one embodiment of imaging element 20, radiation sensor 90 is adapted to sense an amount of light radiated by illumination element 38 during an exposure time and sensor driver 92 is adapted to provide a feedback signal that can be used to help guide operation of illumination control circuit 36. In this embodiment, illumination control circuit 36 receives this feedback signal and compares the amount of light sensed by radiation sensor 90 to an amount of light that illumination control circuit 36 should be causing illumination element 38 to radiate in response to an illumination control signal in use at the time that the light is sensed. Illumination controller circuit 36 can use this comparison to make automatic adjustments to the amount of energy applied to illumination element 38 so that illumination element 38 radiates a desired amount of light in response to an illumination value received by illumination control circuit 36.

In other embodiments, sensor driver 92 and radiation sensor 90 can be adapted to sense light emitted by adjacent imaging elements in a display and/or ambient levels, and an optional adjustment circuit 97 can be provided that is adapted to adjust the amount of light emitted by an imaging element in response to a control signal, with such adjustments being based upon the sensed amount of light from the adjacent light levels and or the ambient light levels.

In another embodiment, sensor driver 92 provides the feedback signal to wireless communication circuit 22 which provides a wireless signal to an external calibration device (not shown) that is adapted to compare the light emitted by an imaging element 20 as indicated by the feedback signal and an actual amount of light measured by the external calibration system so that the external calibration system can transmit a correction factor for use by illumination control circuit 36 in controlling light emitting operations of imaging element 20.

In this way, imaging element 20 can compensate for variations in the efficiency of illumination circuit 24 that arise as a result of manufacturing variations and/or variations that can occur in illumination circuit 24 as a result of use or exposure to environmental irritants over the course of the useful life of imaging element 20. Where advantageous, compensation can also be provided to compensate for variations in the alignment of imaging elements 20.

Alternatively, imaging element 20 can provide a radiation sensor 90 that senses little or no light radiated by illumination element 38. This can be done by the providing a radiation sensor 90 that is not adapted to sense specific types of light emitted by illumination element 38 or by applying filter materials within body 40 between illumination element 38 and radiation sensor 90 so that light emitted by illumination element 38 is absorbed by such filter materials. In another embodiment, radiation sensor 90 can be adapted to sense light that is incident upon imaging element 20 from a range of areas that are largely unaffected by the light emitted by illumination element 38. For example, radiation sensor 90 can be directed away from illumination element 38 such as by being positioned on a side of support 26 that is opposite from a side of support 26 having illumination element 38.

In one embodiment, sensor driver 92 is adapted to generate a data signal that can be stored in memory 80 that is indicative of an amount of radiation incident upon radiation sensor 90 during exposure time. Memory 80 and sensor driver 92 also can be adapted so that sensor driver 92 can store multiple sensed radiation data signals in memory 80. In this embodiment, wireless communication circuit 22 can be adapted to transmit a wireless signal providing stored sends radiation signals to a remote device so that it is not necessary to immediately upload stored sensed radiation signals. This can be used, for example, to allow a number of images to be captured in quick succession and then uploaded at a later time.

In the embodiment of FIG. 8, wireless communication circuit 22 can have a radio frequency transmitter 94. Radio frequency transmitter 94 can be used to transmit a radio frequency signal having data therein. Examples of data that can be transmitted by radio frequency transmitter 94 include but are not limited to data stored in memory 80, sensed radiation signals from sensor driver 92 and identification code data.

Figure 9:
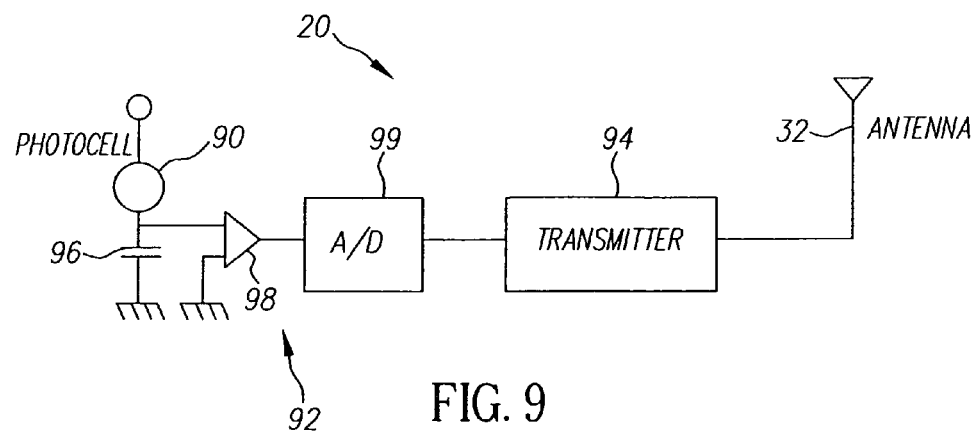
FIG. 9 shows a block diagram schematic of one example of an imaging element having a light sensor and a sensor driver circuit and transmitter.

FIG. 9 shows a block diagram schematic of one example of an imaging element 20 having a radiation sensor 90, sensor driver 92 and radio frequency transmitter 94 in accordance with the embodiment of FIG. 7. In this embodiment, radiation sensor 90 comprises photovoltaic surface for converting radiation that is incident on the photovoltaic surface into an electrical output signal. In the configuration of FIG. 9, radiation sensor 90 provides a voltage across a capacitor 96 to an optional amplifier 98. An optional analog to digital converter 99 accepts the output of amplifier 98 as input and provides, as an output, a corresponding digital sensed value signal. In this embodiment, radio frequency transmitter 94 accepts the digital value from analog to digital converter 99 as input and in combination with antenna 32 generates and transmits an encoded electromagnetic signal conditioned by the sensed value signal.

Figure 10:
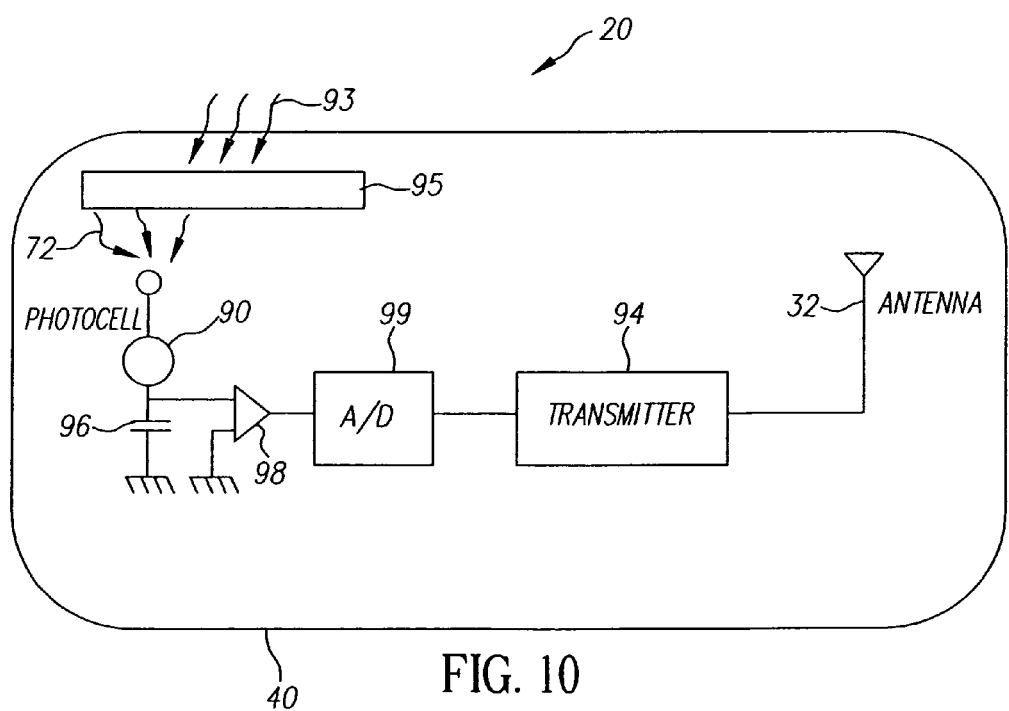
FIG. 10 is a block diagram schematic of an imaging element adapted for use in sensing x-ray radiation.

Referring to FIG. 10, there is shown a block diagram schematic of imaging element 20 shown in FIG. 8 and adapted for use in sensing x-ray radiation. In this embodiment, X-rays 93 are directly incident on a scintillator element 95 such as a phosphor material that radiates visible light when exposed to X-ray radiation. In this embodiment, the scintillator element 95 is within imaging element 20 a coating of a photosensor or as a deposit of a photosensor in a material forming body 40. In response to the level of radiation received, scintillator element 95 provides light which is then sensed by a photosensitive radiation sensor 90, buffered by amplifier 98, converted by analog to digital converter 99, and encoded, available for transmission by transmitter 94.

Figure 11:
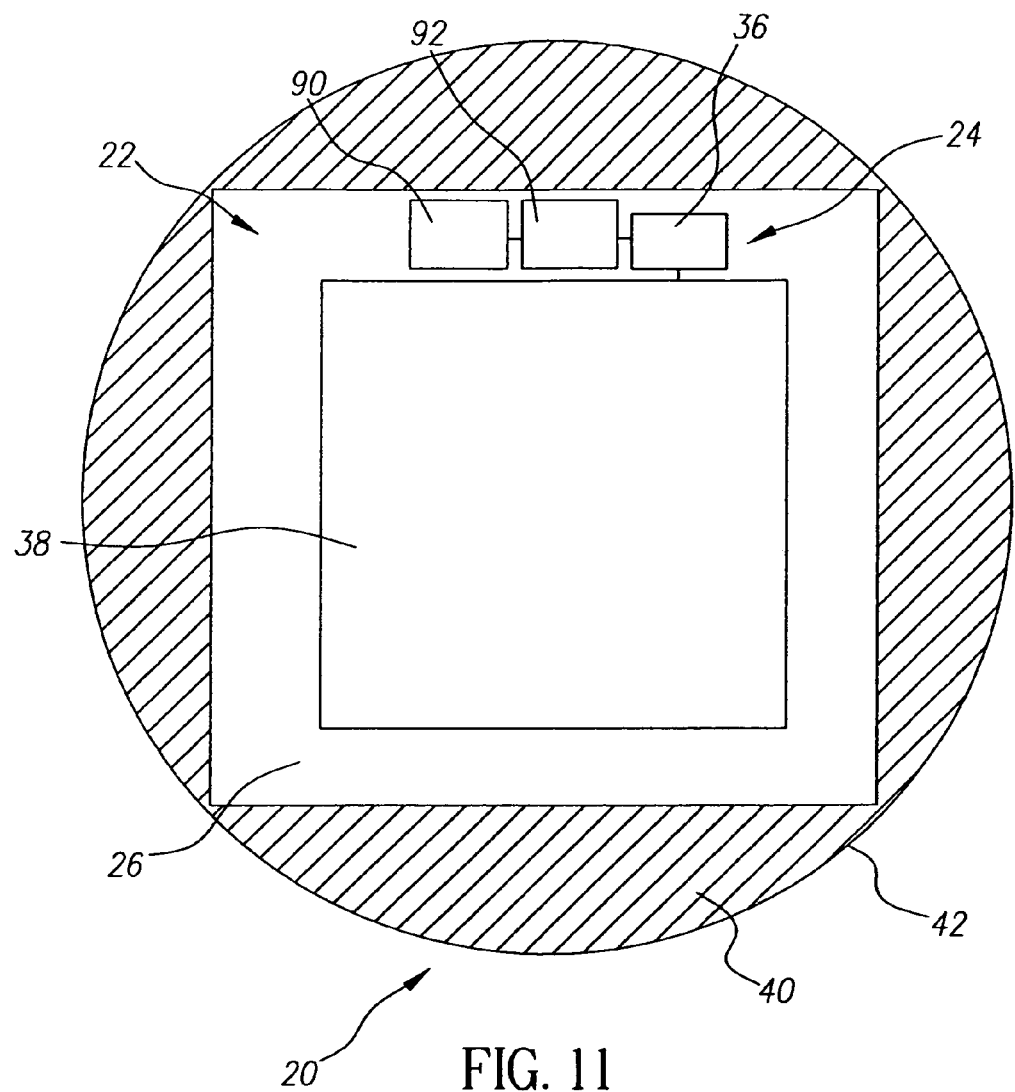
FIG. 11 illustrates an embodiment of an imaging element having wireless communication system that receives light signals.

Referring now to FIG. 11, still another embodiment of imaging element 20 is provided. In the embodiment of FIG. 11, an imaging element 20 is shown having an embodiment of wireless communication circuit 22 that is adapted to receive wireless signals in the form of visible or non-visible light having an illumination value therein and to generate a control signal based thereupon. In the embodiment of FIG. 11, wireless communication circuit comprises radiation sensor 90, and an embodiment of sensor driver 92 that is adapted to sense light signals having illumination values therein and to provide an illumination control signal to operate illumination control circuit 36. Optionally, illumination control circuit 36 can be adapted to modulate light emitted by illumination element 38 to transmit data.

Figure 12:
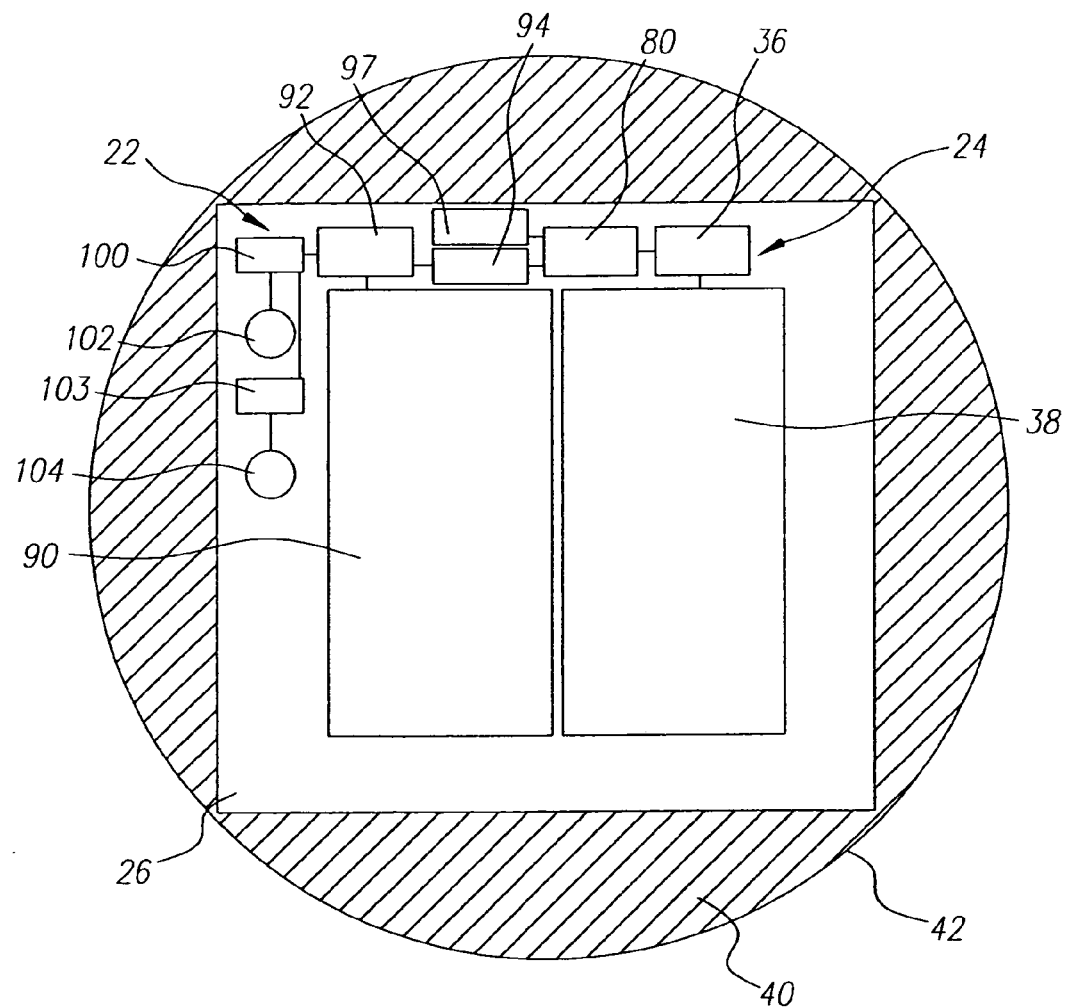
FIG. 12 illustrates an embodiment of an imaging element having wireless communication system that receives and transmits light signals.

In an alternative embodiment, shown in FIG. 12, wireless communication circuit 22 comprises a light sensor 100 such as a photodiode, OLED, PLED or other sensor of a type that can be used to sense visible light, infrared light, ultraviolet light or other non-visible light and to convert the sensed light into a sensed light signal and a light receiver circuit 102. Light signal receiver circuit 102 is adapted to receive the sensed light signal and to interpret the sensed light signal. Light signal receiver circuit 102 has an identification code that performs the same function described above with regard to detecting any illumination values stored in the sensed light and to providing an illumination control signal having a value that is based upon the illumination value when the light signal has the identification code therein. In such an embodiment, light receiver circuit 102 will provide illumination control signal to illumination control circuit 36.

In any embodiment of the invention, radiation sensor 90 and radiation controller 92 and/or light sensor 100 and light receiver circuit 102 and can be adapted to extract operational power from sensed radiation. Further, light receiver circuit 102 can also be used to extract operational power from the sensed radiation. Such extracted power can be applied for use by any energy consuming circuit or system in such an imaging element 20. It will also be appreciated that such a radiation sensor 90 or light sensor 100 can also be capable of extracting power from energy radiated by ambient sources including but not limited to solar radiation.

In the embodiment shown in FIG. 12, wireless communication circuit 22 also comprises a light transmitter circuit 103 that can be used to transmit light signals in the visible or invisible spectrum to a remote receiver (not shown). In the embodiment of FIG. 12, a light transmitter circuit 103 drives a light source 104 to generate data modulated light. However, in other embodiments, light transmitter circuit 103 can provide modulation or other instructional signals to illumination control circuit 36 causing illumination element 38 to be modulated in a manner that conveys data. In certain embodiments, this is done in a manner that is not readily apparent to an observer, such as by encoding the signal using minor variations in the power supplied to illumination element 38.

Figure 13:
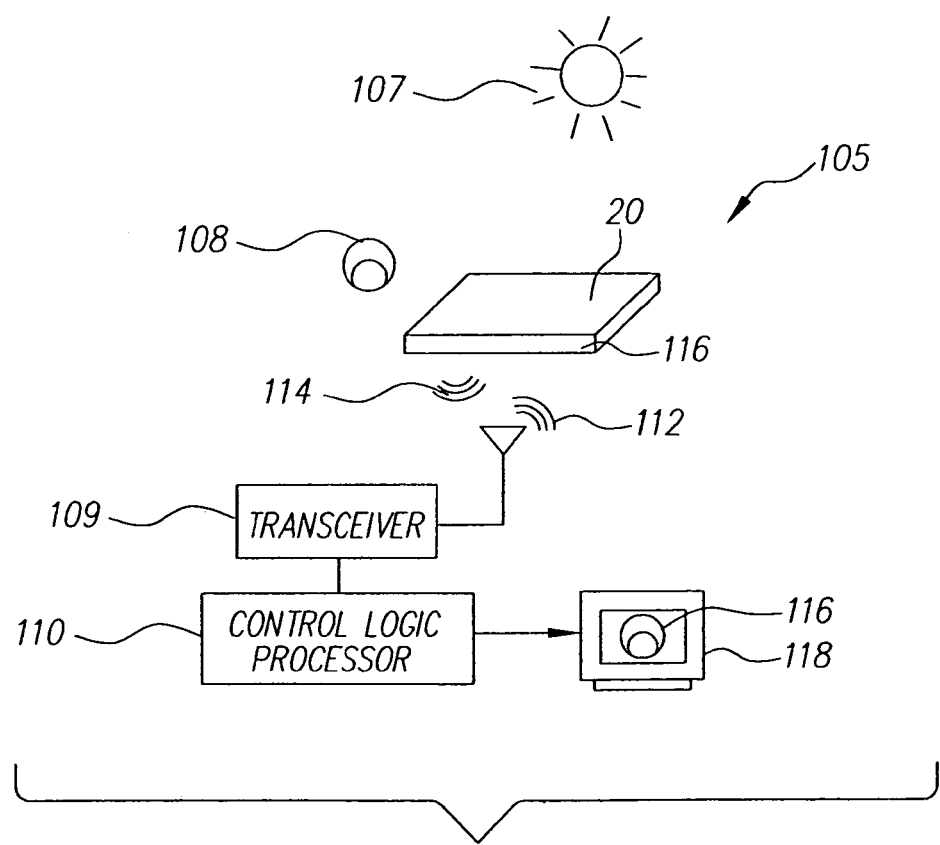
FIG. 13 illustrates a block diagram view of an imaging system using a sensing display.

Referring to FIG. 13, there is shown a block diagram view of an imaging system 105 comprising a sensing display 106 having a plurality of imaging elements 20 having a radiation sensor 90 and a sensor driver 92 as described above. In this embodiment, a radiation source 107 such as the sun provides light that strikes an object 108. Light reflected by the object 108 is sensed by radiation sensors 90 of imaging elements 20. A transceiver 109, controlled by a control logic processor 110, sends and receives wireless signals to and from imaging elements 20. In this embodiment, the wireless signals 112 and 114 are radio frequency signals.

Transceiver 109 is adapted to generate radio frequency signals having generic commands to which all imaging elements 20 in display 106 will respond. For example, when transceiver 109 is used with an imaging element 20 having illumination values stored in memory 80, transceiver 109 can transmit a "present stored image" signal that causes all of the imaging elements 20 in sensing display 106 to emit an amount of light determined by the stored illumination value. Similarly, transceiver 109 can cause an image to be captured by imaging elements 20 of the type having radiation sensors 90 by transmitting a generic "capture" signal to each of the imaging elements 20 in sensing display 106 causing the sensor drivers 92 therein to monitor the amount of radiation sensed by radiation sensors 90 for a common exposure period.

Transceiver 109 is also adapted to generate radio frequency signals that contain identification codes therein which cause only one of the imaging elements 20 to respond. For example, transceiver 109 a can transmit signals individually addressed to individual imaging elements 20 causing the individual imaging elements 20 to emit specific amount of light so that an image that has not yet been stored in memories 80 of imaging elements 20 can be presented on sensing display 106. Similarly, transceiver 109 can transmit signals individually addressed to imaging elements 20 to individually poll imaging elements 20 so that sensed radiation values can be obtained therefrom in a logical manner. These sensed radiation values can be assembled by control logic processor 110 to form an electronic image 116 for presentation on a separate display monitor 118. Alternatively, transceiver 109 can transmit signals causing imaging elements 20 to radiate light in proportion to an amount of light sensed during the exposure period. In this way, an image can be captured and presented using sensing display 106. In one embodiment, sensing display 106 can be used to cause illumination elements 38 of imaging elements 20 to act as radiation sources 107 to emit light that is reflected, for example, by object 108 and sensed by radiation sensors 90.

Figure 14:
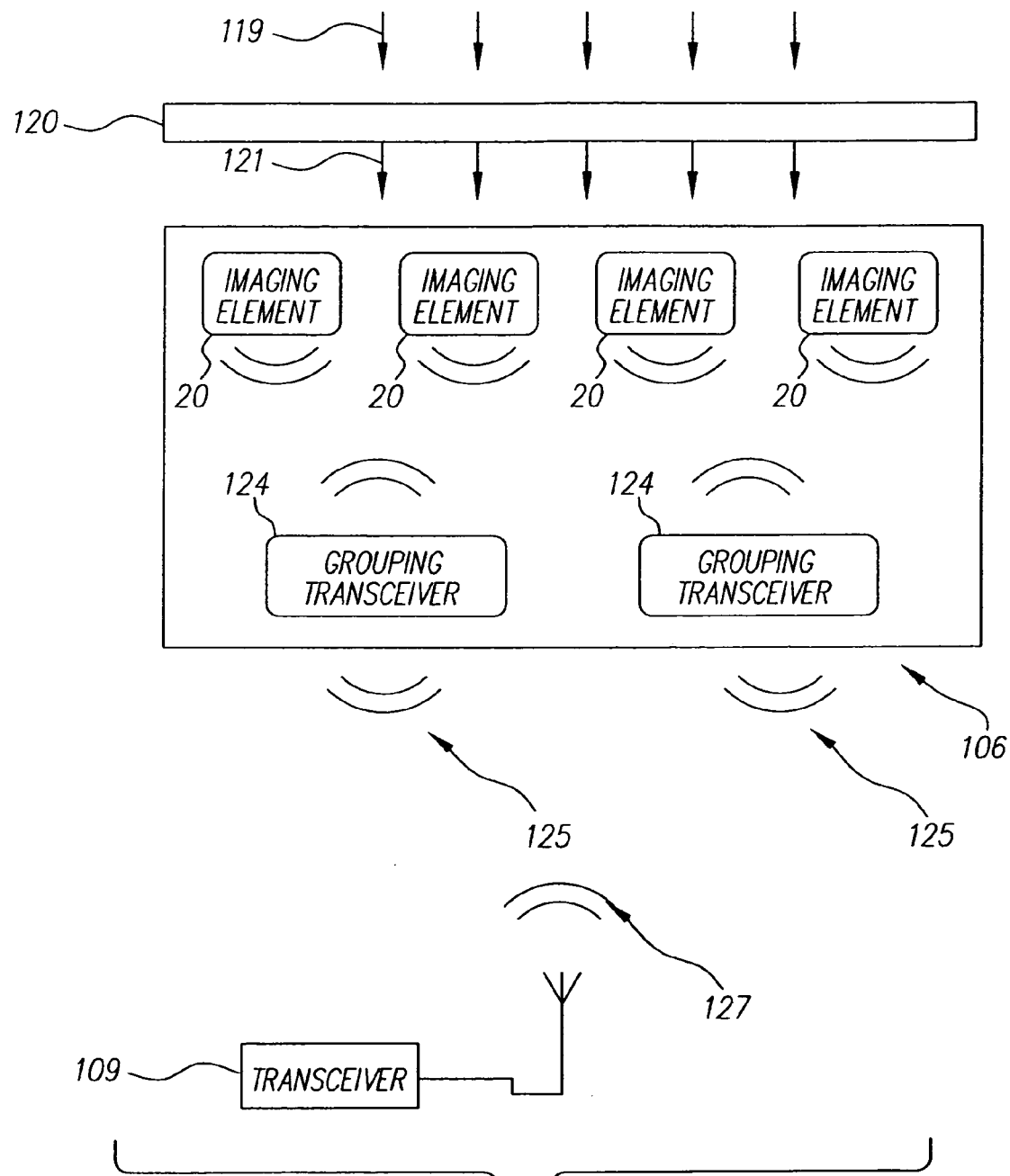
FIG. 14 illustrates a display having a scintillator plate having grouping transceivers.

Among the useful applications for a sensing display 106 of imaging elements 20 is the capture of images of non visible light. Specifically, as shown above, it is possible to use imaging elements 20 that are of a type that is specially adapted for the purpose of sensing x-ray light. However, as shown in FIG. 14, imaging elements 20 that are adapted for capturing visible light can be used for such a purpose when a scintillator plate 120 is positioned proximate to be imaging elements 20. Scintillator plate 120, can be for example as a fluorescent screen that emits a pattern of visible light 121 when exposed to a pattern of x-ray light 122. As shown in FIG. 14, sensing display 106 is positioned proximate to scintillator plate 120 in an arrangement suitable for obtaining a high-resolution image. An image sensing operation is then performed as described above.

Communications Schemes

It can readily be appreciated that the use of miniaturized imaging elements 20, while eliminating the need to form a complex backplane, imposes a requirement for a significant amount of wireless communication in order to read or write data to each of the imaging elements 20 useful in a sensing display 106. Even with a sensing display 106 having a 200 dpi resolution, display 106 of the present invention would have 200×200=40,000 RF devices, that is, 40,000 imaging elements 20, per square inch. To make communication more efficient, various types of polling and grouping schemes may be employed.

Referring again to FIG. 14, there is shown an arrangement of grouping transceivers 124 on a sensing display 106 for communicating with imaging elements 20. Each grouping transceiver 124 communicates with a set of imaging elements 20. Such a set can comprise for example between 2 and 2000 imaging elements. This arrangement reduces the number of RF transactions that must then be executed between transceiver 109 and components within sensing display 106.

Figure 15:
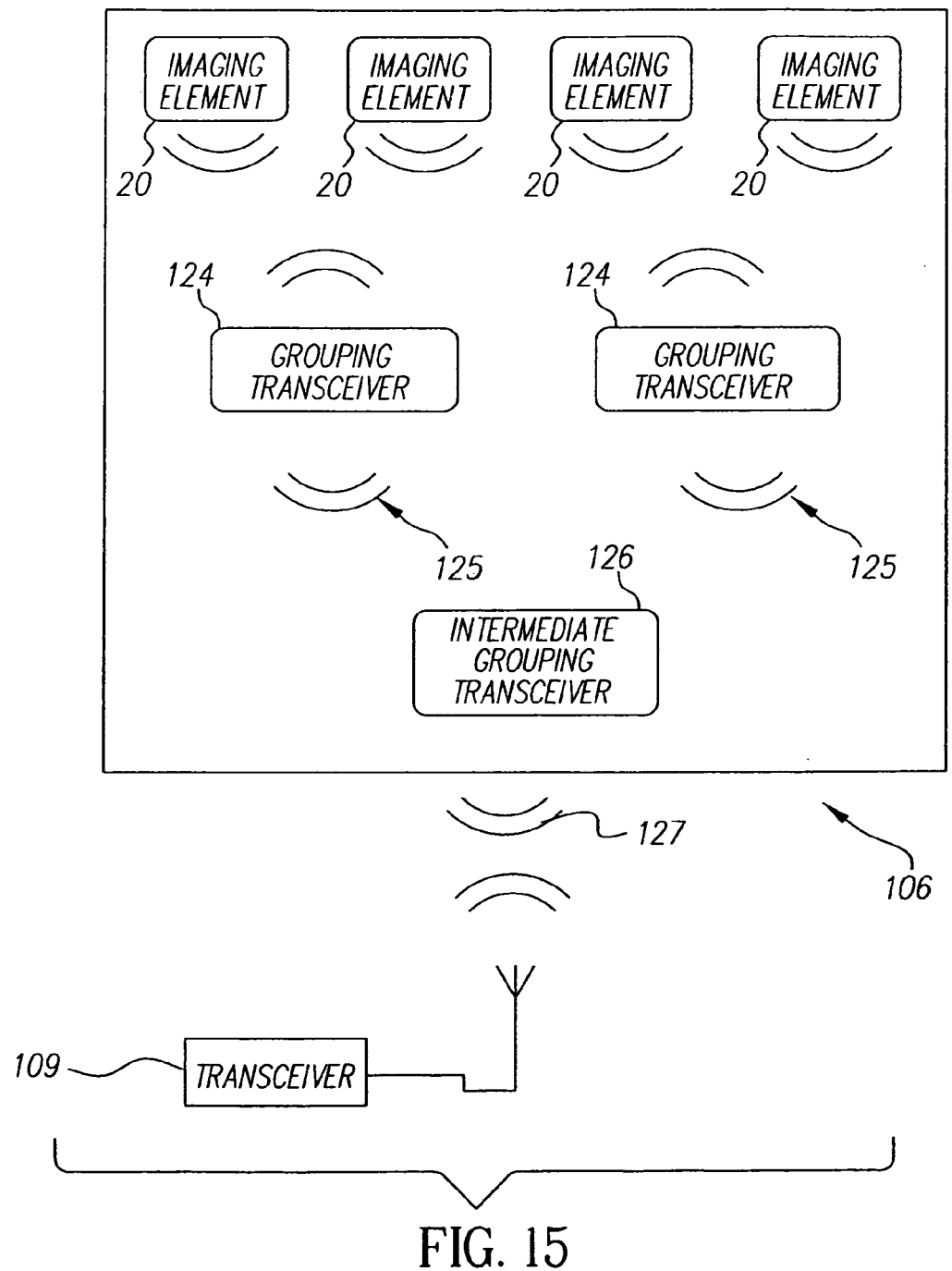
FIG. 15 illustrates a display having grouping transceivers and intermediate grouping transceivers.

Referring to FIG. 15, there is shown another arrangement that extends the use of grouping transceivers 124 on an embodiment of sensing display 106 further having one or more sets of intermediate grouping transceivers 126. These intermediate transceivers 126 are deployed for further relaying of the image-bearing RF signals on sensing display 106. By cascading grouping transceivers 124 in this fashion, the transfer of a complete image between a transceiver 109 and imaging elements 20 of sensing display 106 can be performed in a fraction of the time that would be required for individual polling of imaging elements 20. It will also be appreciated that grouping transceivers 124 and intermediate grouping transceivers 126 can be used with a display 60.

Fabrication Using Fluidic Self Assembly

Figure 16:
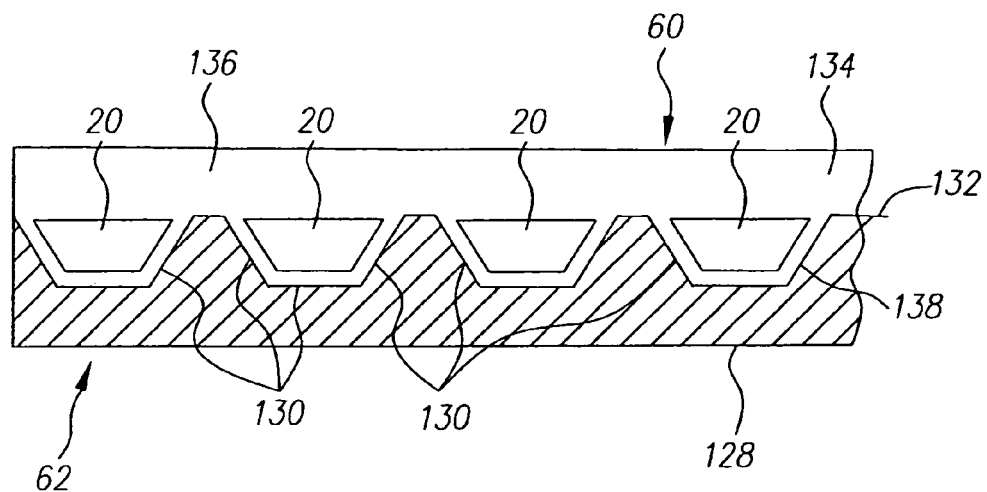
FIG. 16 shows a partial side view of the formation of a sensing display formed using fluidic self-assembly techniques.

Referring to FIG. 16, there is shown, in a partial side view representation, a placement arrangement for imaging elements 20 on sensing display 106 using Fluidic Self-Assembly (FSA) as described in U.S. Pat. No. 5,545,291 entitled "Method for fabricating self-assembling microstructures" and filed by Smith et al. on Dec. 17, 1993. In conventional FSA techniques, a substrate such as substrate 128 is provided having a plurality of cavities 130 on a surface 132 such as first layer 62. A liquid 134 is combined with items such as imaging elements 20 to form a slurry 136. Slurry 136 is applied to surface 132 and the suspended items flow into the cavities and assemble thereto. Liquid 134 is then evaporated or may be retained, such as sealed within sensing display 106, for example. At the end of the assembly process, each cavity 130 in a surface 132 has at least one imaging element deposited therein.

FSA techniques allow a fairly accurate placement of individual imaging elements 20 into individual cavities 130; however, it is possible that a small percentage of cavities 130 are empty. In a preferred embodiment, cavity 130 is dimensioned to allow, at most, a single imaging element 20; however, there may be applications for which larger cavities 130 may be more desirable, even at the risk of multiple imaging elements 20 in a single cavity 130. In such a case, duplicate imaging elements 20 could be detected and disabled.

Where imaging elements 20 have a preferred orientation it will be necessary to provide systems that are compatible with FSA techniques to ensure that imaging elements 20 are fixed in such an orientation. FSA techniques may provide the preferred orientation, such as by shaping walls 138 of each cavity 130 to have a shape that corresponds to a shape of an engagement surface 83 on body 40 of each imaging element 20 so that each imaging element 20 can engage cavity 130 in only one orientation.

Figure 17:
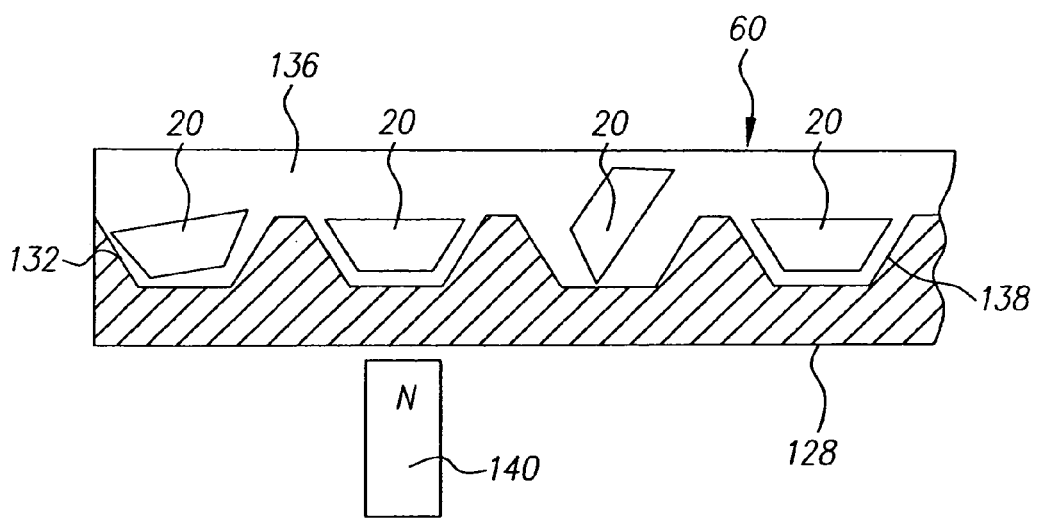
FIG. 17 illustrates the use of an electromagnetic field to help orient imaging elements to engage cavities in a display formed using fluidic self-assembly techniques.

As noted above, in an alternative embodiment, imaging elements 20 can be adapted to positionally react when exposed to an electromagnetic field such as by magnetically polarizing the imaging elements 20 in slurry, and then applying a magnetic field orient imaging elements 20. Referring to FIG. 17, one example of this is shown. In the example of FIG. 17, a magnet 140 that is passed along surface 136 of substrate 128 in order to correctly orient imaging elements 20. Magnet 140 could be any of a number of types of magnets, such as permanent or electromagnetic types, for example.

In an alternate embodiment, body 40 of imaging element 20 is adapted to diffuse, reflect, or otherwise modify received and/or transmitted radiation and/or light so that orientation is not critical. For example, body 40 can be defined to have an arrangement of walls 146 that are at least partially reflective, in a pattern that allows any light incident on any portion of body 40 to be distributed for sensing by radiation sensor 90 without regard to the orientation of radiation sensor. Similarly body 40 can have an arrangement of outer surface 42 that is defined to have a pattern that causes light emitted by illumination element 38 to be distributed so that the light is evenly distributed to provide generally uniform illumination despite the orientation of display element 30.

Imaging Elements Applied in a Coating

An alternate embodiment for manufacturing a display 60 or sensing display 106 uses a coating process to apply imaging elements 20. Miniaturization of imaging element 20 components allows these components to be suspended within a liquid coating medium 142 for application to a surface 144 such as first layer 62 or some other substrate 146 in one or more coats without necessarily creating cavities 130 in first layer 62.

Figure 18:
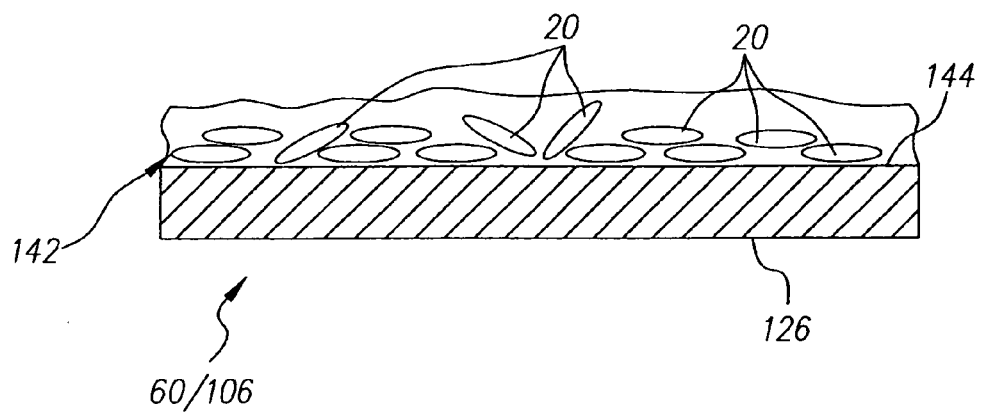
FIG. 18 is a side illustration an embodiment of a display formed by coating techniques.

FIG. 18 shows an embodiment in which a display 60 or a sensing display 106 is fabricated using coating methods to deposit imaging elements 20 onto substrate 128. Coating methods can be similar to applying a paint or other finish, with the additional requirement for having imaging elements 20 suspended within the coating medium 142. Conventional binder types can be used in coating medium 142 for suspending imaging elements 20 during coating and for securing imaging elements 20 into place on substrate 128. Typical binder types include conventional polymeric binders used for paint and finish coatings. Any of a variety of binder types including acrylic, alkyds, epoxies, polyester urethane, or vinyl resins could be used, for example. As is shown in FIG. 18, some irregularity in the distribution of imaging elements 20 can be anticipated. Following the coating process, a number of imaging elements 20 may be oriented at a variety of angles with respect to surface 132 of substrate 126. There may be other irregularities in distribution, such as gaps and overlaps, as is shown in the plane view of FIG. 19, and the sectional view of FIG. 20.

In order to provide a suitable image and represent the image in an array of unevenly spaced pixels, using conventional imaging methods, various types of imaging algorithms can be employed. Imaging algorithms, for example, would apply interpolation to determine the value of a pixel based upon nearby values. Where imaging elements 20 overlap, it may even be necessary to apply an averaging algorithm or to disable the unneeded imaging element 20, depending on the requirements of the imaging application. Thus, while it would be optimal to provide a uniform density coverage for imaging elements 20 over a unit area of substrate 128, there are various methods available for effectively smoothing out distribution irregularities of imaging elements 20.

Figure 19:
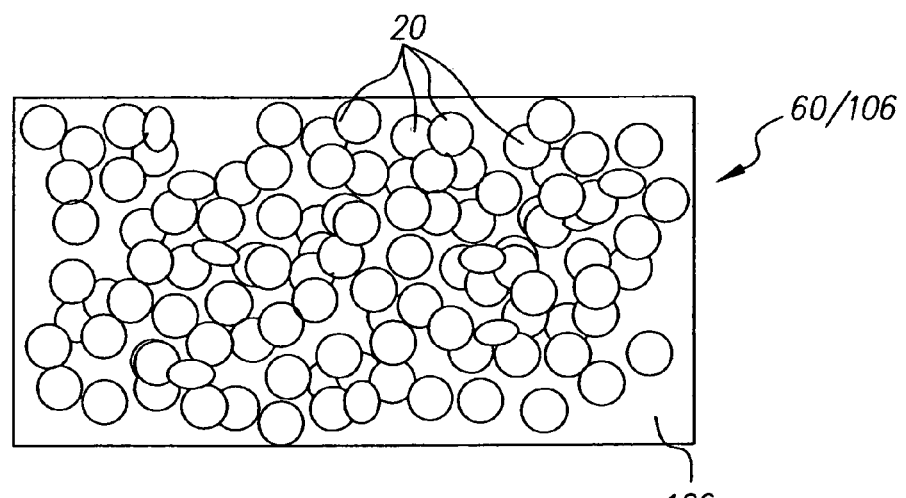
FIG. 19 is a top plane view of the display of FIG. 18.
Figure 20:
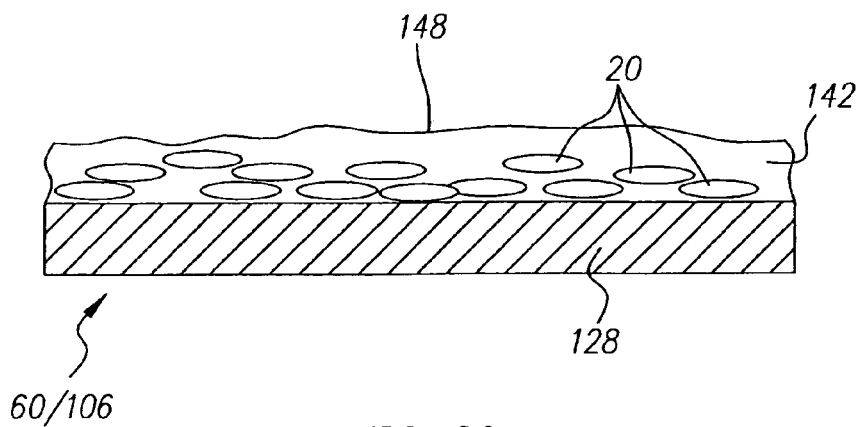
FIG. 20 shows an embodiment of a display having a overcoat layer.

Coating medium 142 may itself provide a protective layer over imaging elements 20 once they are applied to substrate 146. Optionally, as is shown in FIG. 20, a separate display overcoat 148 could be applied atop imaging elements 20 and/or coating medium 142. Display overcoat 148 could be any number of materials. In one embodiment, display overcoat 148 is a transparent polyurethane; however, display overcoat 148 could have various properties for handling light, including diffusive or filtering properties. Display overcoat 148 could act as a type of color filter, for example, blocking light of certain wavelengths, so that only light of a selected wavelength is sensed by imaging elements 20. Display overcoat 148 could also be a phosphorescent material for absorbing and radiating light energy at certain useful wavelengths, for example. Use of a diffusive phosphorescent material could be advantageous, for example, where imaging elements 20 are skewed at angles rather than parallel to the surface of substrate 126 as was shown in FIGS. 18 and 19.

Multiple coating layers could be applied to obtain improved uniformity or to apply different types of components with each coating operation providing layer and components as described generally above with respect to FIG. 5. For example, a first coating could be applied for positioning grouping transceivers 124 on one layer. A second coating could be applied atop this first layer to position imaging elements 20 on sensing display 106.

Double-Sided Embodiments for Sensing Display

Figure 21:
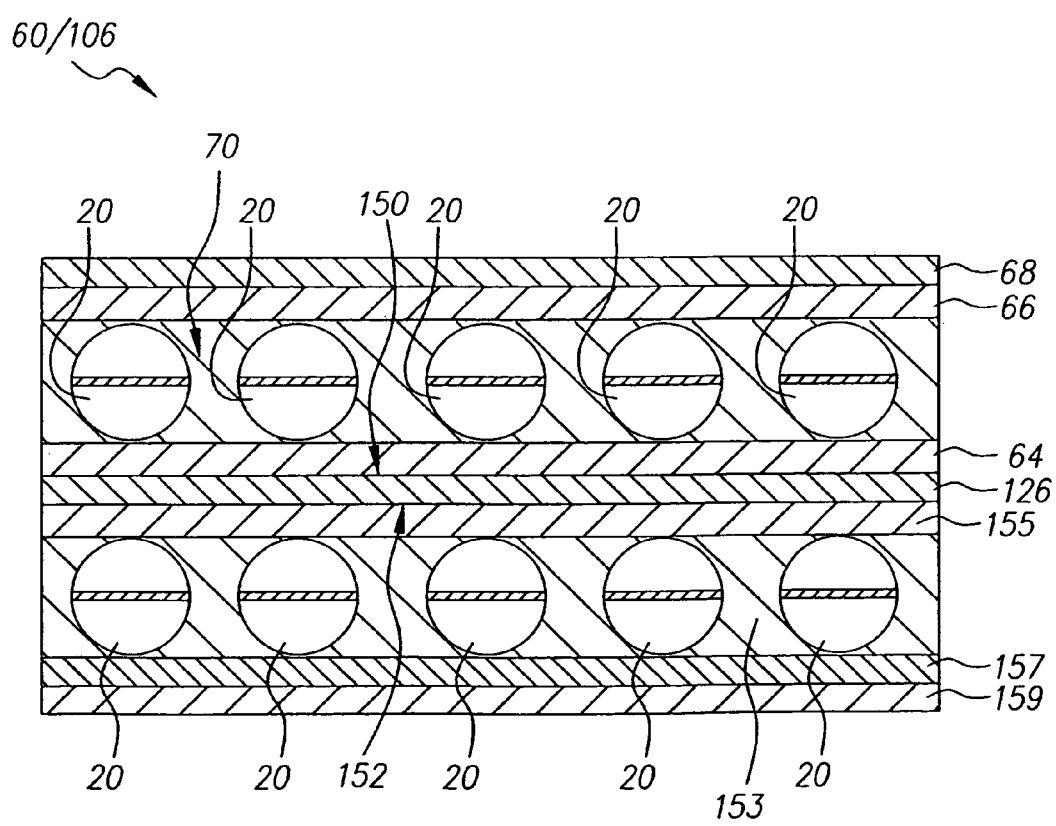
FIG. 21 shows an embodiment of the sensing display having imaging elements on two sides of a substrate.

Referring to FIG. 21, there is shown an embodiment in which a display 60 or sensing display 106 is double-sided, having imaging elements 20 disposed on first side 150 and second side 152 of substrate 128. This arrangement allows a number of options for use of display 60 or sensing display 106. Optionally, where substrate 146 is transparent, imaging elements 20 on both sides of sensing display 106 could be used to capture an image of the same scene at higher resolution.

As shown in FIG. 21, imaging elements 20, first conductors 64 and second conductors 66 and second layer 68 can be provided on one side of substrate 128 with first conductors 155 and second conductors 157 and an insulator layer 153 having imaging elements 20 therein can be formed on another side of substrate 128. Additional layers, such as second layer 68 and additional second layer 159, can also be applied as needed. In another optional embodiment, both first side 150 and second side 152 of sensing display 106 could be provided with a phosphor coating for absorbing radiation energy for subsequent scanning and sensing using imaging elements 20.

Calibration of Displays

Whether or not imaging elements 20 are arranged in an orderly matrix arrangement, using cavities 130 as was described with reference to FIGS. 16 and 17 or randomly distributed using the coating method described with reference to FIGS. 18 and 19, each display 60 or sensing display 106 should have some mechanism for determining location information that associates each imaging element 20 with the location of each imaging element 20 on display 60 and sensing display 106. This can be done, for example by assigning Cartesian (x,y), polar coordinates or other logical two-dimensional or even three dimensional location information for each imaging element 20.

Figure 22:
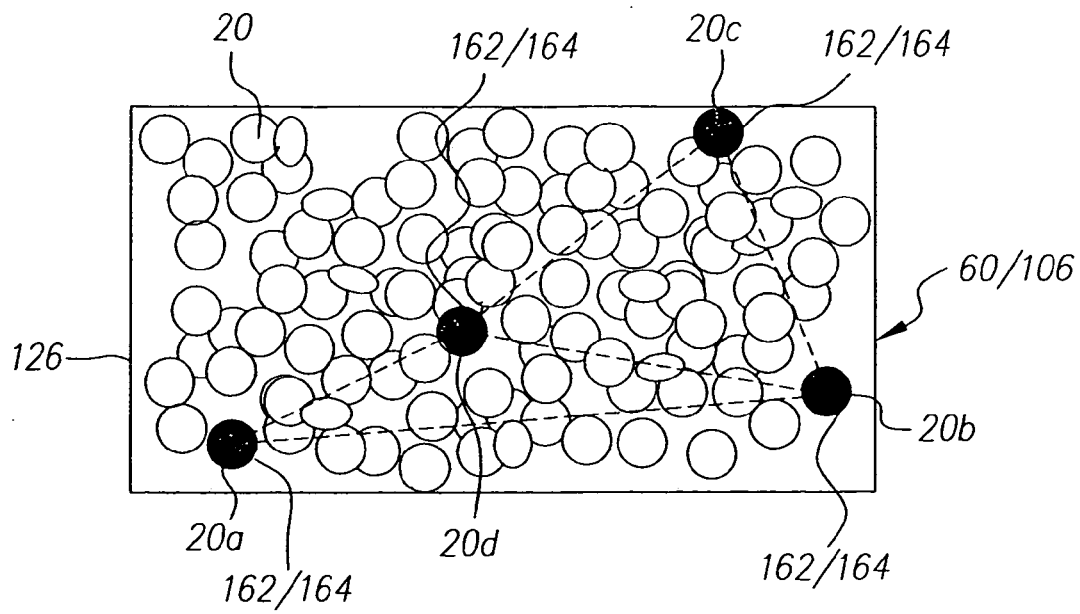
FIG. 22 illustrates one embodiment of a method for determining locations of imaging elements on a display.

FIG. 22 illustrates another embodiment of a method for determining location information for associating each imaging element 20 with a location on a sensing display 106. This embodiment, an external calibration system applies a radiation pattern 162 to known locations on sensing display 106. The radiation pattern 162 can be a single point 164 as shown, or it can comprise multiple points. The imaging elements 20 on sensing display 106 are polled during exposure. Each imaging element 20 that is exposed to the radiation can respond to the polling with signals indicative of such exposure and address information. Where grouping transceivers 124 and/or intermediate grouping transceivers 126 are used for example in a sensing display 06 having imaging elements 20, a responsive signal can be received therefrom that provides address information or other information that identifies the grouping transceiver and the intermediate grouping transceiver.

Figure 23:
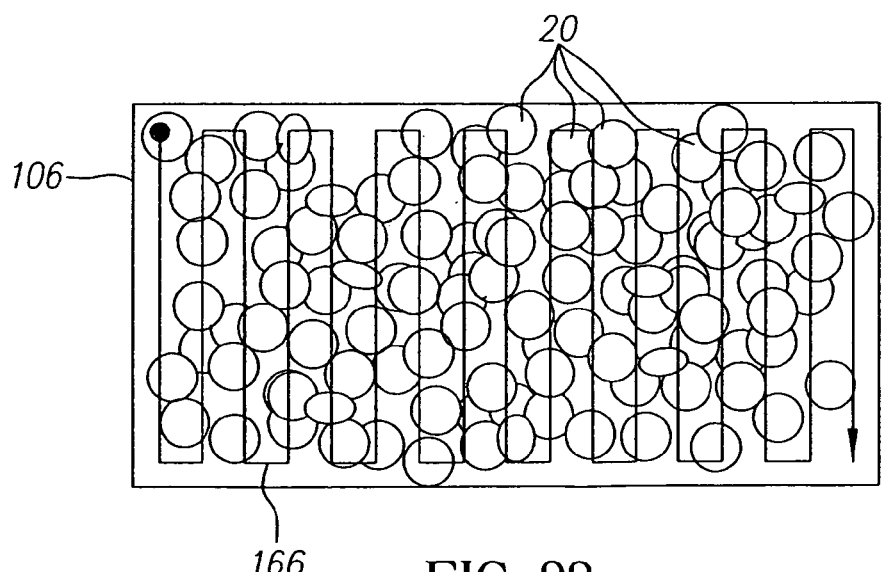
FIG. 23 illustrates another embodiment of a method for determining locations of imaging elements on a display.

Because the location on the sensing display 106 that is exposed radiation is known, it can be determined that the imaging element 20 or imaging elements 20 that respond with signals indicative of each such exposure are located at the position of exposure. Location information that links each such location with responsive imaging elements is stored. The pattern of radiation 162 is swept across sensing display 106 following a sweep path 166, one example of which is shown in FIG. 23, until imaging elements 20 are identified for each location in a display area of sensing display 106. Conversely, a similar approach can be used in which signals are sent causing individual ones of the imaging element 20 to radiate light, and by determining the location of the light radiating imaging element 20.

The method outlined above also allows a type of calibration for each imaging element 20. The radiation pattern 162 provides a signal of known strength to known areas of display 106. However, in other embodiments, radiation source 152 can comprise other light sources such as line arrays. The response signal may indicate, for example, the angular position of imaging element 20, which may not be at the angle of surface 132 as was described with reference to FIG. 18. Alternatively, the response can be a function of the efficiency of illumination elements 38 of imaging elements 20. This information can be used to provide calibration information for each imaging element 20. In embodiments wherein imaging element 20 has a radiation sensor 90 that is adapted to sense radiation emitted by illumination element 38, radiation sensor 90 and sensor driver 92 can provide such a signal for communication to an external device which can use this signal to determine calibration information based upon this signal.

In another embodiment, a different method for determining location information associating a position of any individual imaging element 20 on the surface of a sensing display 106 is to use triangulation. With this method, each point is located based on its relative distance from and direction from a set of three reference points. Referring to FIG. 21, there is shown sensing display 106 having a randomized array of imaging elements 20. Imaging elements 20a, 20b, and 20c serve as reference points for the triangularization process. Based on the coordinates of reference points 20a, 20b, and 20c, any fourth point can be located, as is represented by point 20d, for example. The triangularization process can be carried out iteratively for all imaging elements 20 on the surface of sensing display 106, using the same reference points of imaging elements 20a, 20b, and 20c. Optionally, different sets of reference points can be used for obtaining relative coordinates for other imaging elements 20 on the surface of sensing display 106. Triangularization logic can use methods to determine relative distance based on comparative signal strength or may use methods for determining the angular direction of a signal source.

There are a variety of forms in which the grain location information can be stored. The stored imaging element 20 location information could comprise, in one specific embodiment, a data Look-Up Table (LUT) correlating a imaging element 20 identifier to a coordinate position (x,y) could be maintained. Using this method, imaging element 20 does not need to store its coordinate position data in an internal memory. For example, each imaging element 20 can be preprogrammed with a unique address that is provided each time that the imaging element 20 responds to the polling signal. In this embodiment, the imaging element location data comprises a look-up table that associates each address of a imaging element 20 with the location on display 106 that energy was applied to add a point when the respective imaging element 20 provided a signal indicative of exposure to the energy.

In another embodiment, each imaging element 20 is adapted to receive and store location information indicating the location on sensing display 106 at which energy was applied at a time when the respective imaging element 20 provided a signal indicative of exposure to such energy. In this embodiment, therefore, each time, after calibration, that the imaging elements 20 of sensing display 106 are polled, such digital imaging elements 20 will respond with a signal indicating the intensity of the exposure and the location of the grain reporting the intensity signal. This allows for rapid reconstruction of a digital image using the information provided in response to the polling signal.

It will be appreciated that while these methods have been described with reference to a sensing display 106, they are equally applicable to determining the location of imaging elements 20 that are not adapted to sense radiation.

In still another embodiment, imaging element location information can, at least in part, the stored in memories in a grouping transceiver 124 and/or intermediate grouping transceiver 126.

Sensing/Display Element Embodiment

Figure 24:
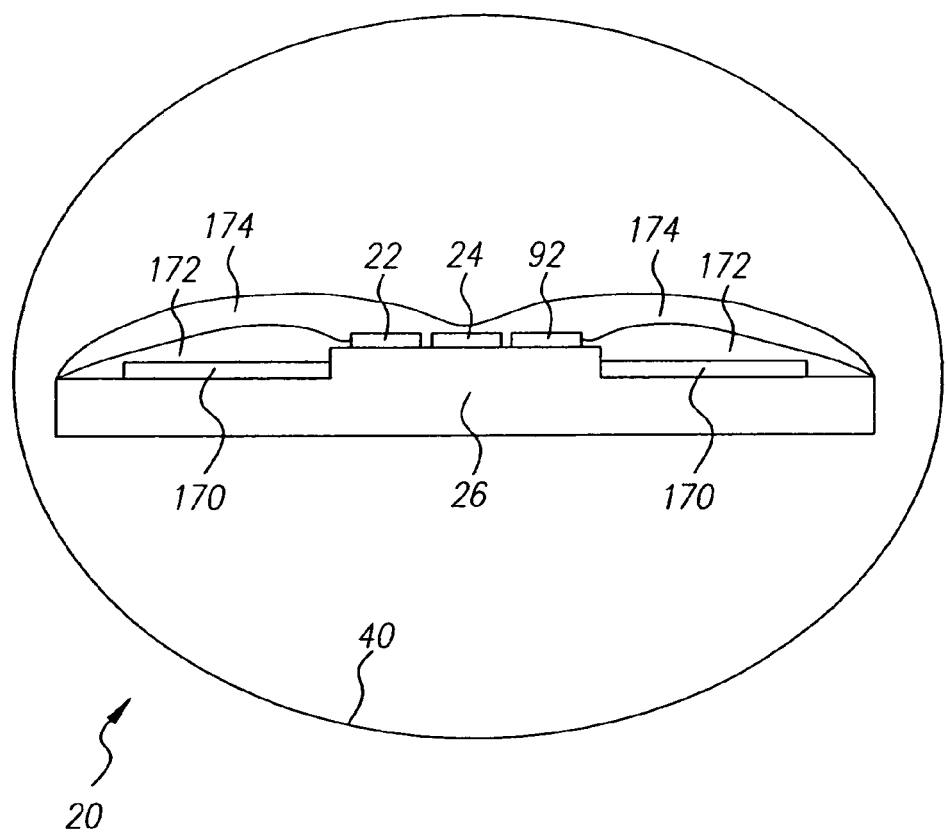
FIG. 24 illustrates another embodiment of an imaging element.

In certain of the above described embodiments, imaging elements 20 have been described that incorporate illumination element 38 and a radiation sensor 90 that are provided in the form of separate components. However, in the embodiment shown in FIG. 24, an imaging element 20 is provided that is adapted to use a single material for both light emission and radiation sensing. In the embodiment shown in FIG. 24 an imaging element is provided having a anode layer 170, a diode layer 172 and a substantially transparent conductive layer 174 assembled about a substrate 26 having a communication circuit 22, an illumination control circuit 24 and a sensor driver 92. In this embodiment, both of illumination control circuit 24 and sensor driver 92 are adapted with electrical connections to a combined illumination element 38 and radiation sensor 90 having the anode layer 170, diode layer 172 and/or conductive layer 174 so that electrical signals can be provided to or received from the anode layer 170, diode layer 172 and/or conductive layer 174. In this embodiment, the material for the diode layer comprises an organic or inorganic diode material that is capable of emitting light when driven in a first manner by illumination control circuit 24 and capable of sensing light when driven by or otherwise interacting with sensor driver 92. Examples of material that can be used in this fashion include OLED and PLED materials. When a potential difference is applied across a cathode and anode disposed about a supply of such material, electrons from the electron injecting layer and holes from the hole injecting layer are injected into the light emitting layer, they recombine, emitting light. This process can be reversed so that exposure of such materials to light causes such materials to generate a difference in potential across the cathode and anode when exposed to light. Examples of such OLEDs and PLEDs are described in the following United States patents, all of which are incorporated herein by this reference: U.S. Pat. No. 5,707,745 to Forrest et al., U.S. Pat. No. 5,721,160 to Forrest et al., U.S. Pat. No. 5,757,026 to Forrest et al., U.S. Pat. No. 5,834,893 to Bulovic et al., U.S. Pat. No. 5,861,219 to Thompson et al., U.S. Pat. No. 5,904,916 to Tang et al., U.S. Pat. No. 5,986,401 to Thompson et al., U.S. Pat. No. 5,998,803 to Forrest et al., U.S. Pat. No. 6,013,538 to Burrows et al., U.S. Pat. No. 6,046,543 to Bulovic et al., U.S. Pat. No. 6,048,573 to Tang et al., U.S. Pat. No. 6,048,630 to Burrows et al., U.S. Pat. No. 6,066,357 to Tang et al., U.S. Pat. No. 6,125,226 to Forrest et al., U.S. Pat. No. 6,137,223 to Hung et al., U.S. Pat. No. 6,242,115 to Thompson et al., and U.S. Pat. No. 6,274,980 to Burrows et al.

Another example of a material that can be used in this fashion is an inorganic LED material such as a material fabricated from III-V compound semi-conductors and a material II-VI semi-conductors. When a forward difference of potential is applied across junctions formed in these devices electron in holes injected into the device recombine, emitting light. This process can be reversed so that the exposure of such materials to light causes generation of electron hole pairs; these electron hole pairs, known in the art as carriers can be sensed either as a current or as change in potential.

Those of skill in the art will recognize that a variety of other types of materials and devices are known that have the capability to both emit and sense light and can be used in like fashion.

It will be appreciated that this embodiment, the size of a sensing and light emitting imaging element 20 can be reduced as compared to the size of a sensing and light emitting imaging element that requires a separate illumination element 38 and radiation sensor 90. It will also be appreciated that embodiments such as the embodiments of FIGS. 1B and 1C can be adapted with such a light emitting and sensing material and a radiation sensor 92 for use in a sensing and emitting embodiment of imaging element 20.

In this or other embodiments, an imaging element 20 having a radiation sensor 90, communication circuit 22 can be adapted to receive illumination values or to transmit a signal based on sensed radiation using digital or analog wireless communication schemes. In an analog example, communication circuit 22 can have a voltage controlled oscillator and a mixer that adjust the frequency of radio frequency signals to provide a sensed voltage level signal that can be detected, for example by a grouping transceiver 124 which then converts this signal into a digital signal for transmission to a transceiver as generally described above.

Multiple Part Illumination Element

Figure 25:
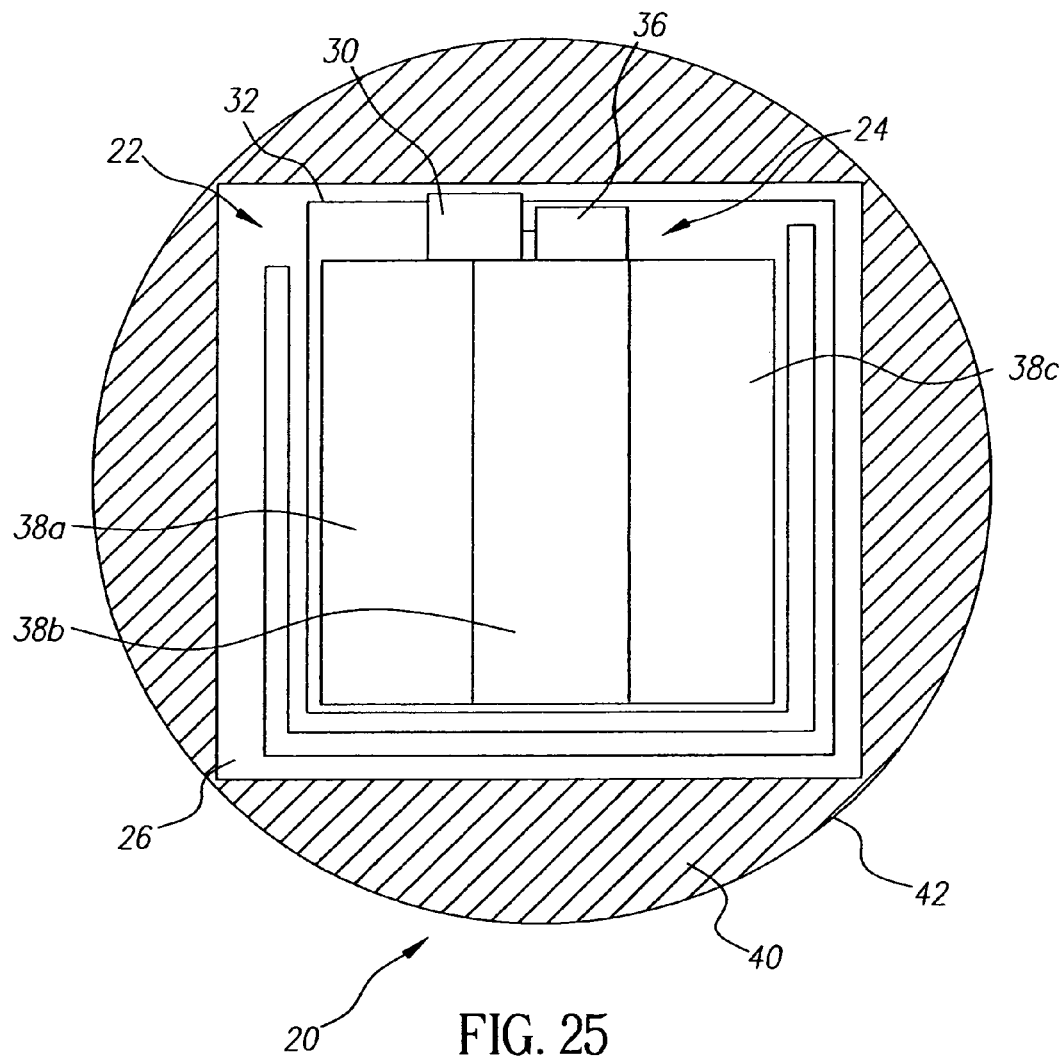
FIG. 25 shows another embodiment of an element having a multiple part illumination element.

As is shown in FIG. 25, in certain applications, it can be useful to provide an illumination element 38 that is capable of emitting more than one separately controllable type of light. For example, it can be useful to provide an imaging element 20 that is capable of generating multiple colors of light, or of generating light that is both in the visible and non-visible bands. In the example shown in FIG. 25, imaging element 20 has three parts, a red part 38a that emits red light, a blue part 38b that emits blue light, and a green part 38c that emits green light. By controlling the amount of light emitted by each of parts 38a, 38b and 38c, a wide range of colors can be emitted.

The invention has been described with reference to a preferred embodiment. However, it will be appreciated that variations and modifications can be effected by a person of ordinary skill in the art without departing from the scope of the invention.

PARTS LIST 20 imaging element
22 wireless communication circuit.
24 light source
26 support
30 radio frequency receiver circuit
32 antenna
36 electrodes
36 illumination control circuit
37 deposit of light emitting material
38 illumination element
38a-38c illumination element parts
40 body
42 outer surface of body
44 first electrically conductive portion
46 second electrically conductive portion
48 electrical insulator
52 electrical conductor
54 electrical conductor
60 display
62 first layer
64 first conductive layer
66 second conductive layer
68 second layer
69 top surface
70 overcoat layer
71 array
72 insulative layer
74 power supply
76 battery layer
78 interlayer power connector
80 memory
90 radiation sensor
92 sensor driver
93 X-rays
94 radio frequency transmitter
95 scintillator element
96 capacitor
97 adjustment circuit
98 amplifier
99 analog to digital converter
100 light sensor
102 light receiver circuit
103 light transmitter circuit
104 light source
105 imaging system
106 sensing display device
107 radiation source
108 object
109 transceiver
110 control logic processor
112 wireless signal
114 wireless signal
116 display monitor
118 electronic image
120 scintillator plate
121 visible light
122 X-ray light
124 grouping transceiver
126 intermediate grouping transceiver
128 substrate
130 cavity
132 surface
134 liquid
138 wall
140 magnet
142 coating medium
144 surface
146 walls
148 overcoat
150 first side
152 second side
153 insulator layer
155 first conductor
157 second conductor
159 additional second layer
162 radiation pattern
164 sweep path
166 sweep path
170 anode layer
172 diode layer
174 transport conductive layer
M Microlens

The invention claimed is:

1. A method for forming a display using imaging elements adapted to generate light, the method comprising the steps of:
    providing a first surface;

providing a plurality of imaging elements on the first surface; and determining location information for each of the imaging elements, wherein each of the imaging elements includes:

an individual wireless communication circuit adapted to detect a wireless communication signal and to generate a control signal;

an illumination circuit having an illumination element, said illumination circuit being adapted so that the illumination element generates light at an intensity that is based upon the control signal; and a body containing the wireless communication circuit and the light source; wherein said body occupies a space that is less than about five cubic millimeters.

2. The method of claim 1, wherein the step of providing a first surface comprises providing a first surface of a flexible material having recesses therein adapted to receive the imaging elements, and wherein the step of providing imaging elements on the first surface further comprises binding the imaging elements to the surface by applying a fluidic slurry containing a carrier fluid and the imaging elements to the first surface that the imaging elements can bind to the recesses.

3. The method of claim 1, wherein the step of providing a first surface comprises providing a first surface of a web of a flexible material and wherein the step of providing imaging elements comprises applying a fluidic slurry containing a carrier fluid and the imaging elements to the first surface; and wherein the step of providing the imaging elements on the first surface comprises modifying the fluid so that the fluid holds the imaging elements on the first surface.

4. The method of claim 1, wherein the step of providing a first surface comprises providing a first surface of a web of a flexible material, wherein the step of providing imaging elements comprises applying a fluidic slurry containing a carrier fluid and imaging elements to distribute said imaging elements on the first surface and joining a second surface to hold the imaging elements to between the first surface and the second surface.

5. The method of claim 1, further comprising the steps of providing, in at least one layer, on the first surface a first electrical conductor adapted to engage a first portion of the imaging elements, and a second electrical conductor adapted to engage a second portion of the imaging elements, with an insulator therebetween so that electrical energy can be applied from the first conductor to the second conductor and to the imaging elements.

6. The method of claim 1, further comprising the steps of providing on the first surface a power supply circuit adapted to provide power to the imaging elements.

7. The method of claim 6, further comprising the steps of forming on the first surface, an electrical power supply capable of storing electrical power.

8. The method of claim 1, wherein the location information comprises data that associates individual ones of the imaging elements with particular locations on the display so that the location information can be used to transmit wireless signals to selected imaging elements in the display so that said imaging elements can be selectively actuated to form an image.

9. The method of claim 6, wherein the power circuit is adapted to provide power from an external source to the imaging elements.

10. The method of claim 6, wherein said power supply circuit comprises a fluid provided around the imaging elements, said fluid being adapted to provide a difference of potential across electrically conductive portions of the imaging elements.

11. The method of claim 6, wherein the power circuit incorporates an antenna to receive wireless signals and conversion circuits to convert received signals into a source of sufficient electrical power to allow the imaging elements to emit a desired amount of light wherein the step of providing imaging elements on the first surface.

12. The method of claim 1, further comprising the step of positionally aligning the imaging elements on the surface.

13. The method of claim 1, wherein the imaging elements are adapted to positionally respond to an applied electromagnetic field further comprising a step of positionally aligning the imaging elements by an electromagnetic field adapted to align the imaging elements in a preferred orientation.

14. The method of claim 1, wherein the step of providing a first surface comprises the step of applying a liquid slurry having imaging elements therein to the first surface so that the imaging elements are bound to the surface.

15. The method of claim 1, wherein the step of providing a first surface comprises a providing the mixture of a surface forming material and imaging elements and using the mixture to form a surface.

16. The method of claim 1, wherein the first surface is adapted with cavities shaped to receive the imaging elements.

17. The method of claim 1, wherein the step of providing a first surface comprises applying a coating of a binding material having imaging elements therein said binding material being adapted to secure the imaging elements to said first surface.

18. A method for forming a display, the method comprising the steps of:

providing a slurry comprising a plurality of imaging elements in a fluid each imaging element being adapted to cause a radiation sensor to sample radiation and to individually transmit a wireless signal indicating the amount of radiation in the sample and with each imaging element further being adapted to individually receive a wireless signal having an illumination value therein and to generate a control signal causing an illumination element to generate light at an intensity that is determined based upon the control signal;

said plurality being adequate in number for sampling an irradiance pattern with sufficient resolution to allow a discernable image to be assembled based upon the samples;

using said slurry to provide a plurality of individual imaging elements across an image capture area of a surface; and associating each imaging element with location information so that signals from each imaging element can be assembled to form an image of the light that is incident upon the imaging element.

19. The method of claim 18, wherein the step of using said slurry to provide a plurality of individual imaging elements across an image capture area of a surface comprises the step of:

magnetically orienting a plurality of said individual imaging elements and fixing the individual imaging elements in the oriented arrangement.

20. The method claim 18, wherein the step of magnetically orienting said plurality of said individual imaging elements comprises the step of providing relative motion between a magnet and said surface.

21. The method of claim 18, wherein the step of associating comprises directing energy at a point on the surface so that an imaging element at that location will generate a signal and using the signal generated by the imaging element at the location as a reference point for determining the location information for other imaging elements on said surface.

22. The method of claim 18, wherein the step of associating comprises directing energy at an arrangement of locations on the surface so that an imaging element at those locations will generate a signal and using the signal generated by the imaging element at each location to determine the location information for that imaging element.

23. The method of claim 18, further comprising the step of causing the imaging elements to sample light incident thereon for a sample period, wherein the associating step comprises the steps of:
  directing a wireless signal to a sequence of locations on the surface adapted to cause an imaging element on the surface to provide a wireless signal indicative of the exposure of the imaging element to the energy; and
  associating with each received wireless signal with location information that is determined based upon the location at which the wireless signal is directed.

24. The method of claim 23, wherein the energy directed at each location is constant and wherein each imaging element is adapted to provide said wireless signal with indicative of the energy level sensed by the each imaging element, with the method further comprising the step of determining the relative sensitivity of each imaging element based upon the sensed energy level.

25. The method of claim 24, further comprising the steps of directing energy at one other point on the surface and using a signal from said imaging element at said reference point and at least one other signal from a second said imaging element at the other point for locating at least a second reference point so that the first and second reference points can be used to locate the other imaging elements.

26. The method claim 18, wherein the step of associating comprises:
  determining location information for each imaging element; and
  transmitting differentiable location data to said imaging element, so that a signal transmitted by said imaging element has at least the identification data and a data value representing the amount of radiation in a sample.

27. The method of claim 18, wherein said surface is partially reflective.

28. The method of claim 18, wherein the step of said surface has cavities thereon adapted to receive the imaging elements and wherein said dispensing fluid carries the imaging elements so that substantially all of the cavities receive a imaging element.

29. The method of claim 28, wherein the cavities are adapted to receive the imaging elements and to position the imaging elements in a desired orientation.

30. The method of claim 18, wherein said fluid is adapted to hold the imaging elements to a surface.

31. The method of claim 16, wherein the fluid is processed to form the surface.

32. A method for assigning positional coordinates to an imaging element in a grouping of imaging elements comprising the steps of:
  identifying a first reference imaging element at a first coordinate reference point, a second reference imaging element at a second coordinate reference point, and a third reference imaging element at a third coordinate reference point;
  prompting another imaging element to emit at least one locator signal;
  receiving said locator signal and locator signals from at least each of said first, second, and third reference imaging elements; and
  applying a triangulation calculation to identify the positional coordinates of the imaging element relative to said first, second, and third coordinate reference points.

* * * * *